US012782448B2

(12) United States Patent
Singer et al.

(10) Patent No.: US 12,782,448 B2
(45) Date of Patent: Nov. 3, 2026

(54) MODULAR ENERGY STORAGE SYSTEM

(71) Applicant: STABL Energy GmbH, Munich (DE)

(72) Inventors: Arthur Singer, Munich (DE); Nam Truong, Neubiberg (DE)

(73) Assignee: STABL ENERGY GMBH, Munich (DE)

(*) Notice: Subject to any disclaimer, the term of this patent is extended or adjusted under 35 U.S.C. 154(b) by 677 days.

(21) Appl. No.: 17/987,129

(22) Filed: Nov. 15, 2022

(65) Prior Publication Data

US 2023/0071975 A1 Mar. 9, 2023

Related U.S. Application Data

(63) Continuation of application No. PCT/EP2021/064236, filed on May 27, 2021.

(30) Foreign Application Priority Data

May 28, 2020 (EP) .................................... 20177203

(51) Int. Cl.
*G01R 31/3842* (2019.01)
*G01R 31/3828* (2019.01)
(Continued)

(52) U.S. Cl.
CPC ..... *G01R 31/3842* (2019.01); *G01R 31/3828* (2019.01); *G01R 31/389* (2019.01);
(Continued)

(58) Field of Classification Search
CPC ......................... G01R 31/3842; G01R 31/389; G01R 31/392; G01R 31/3828; H02J 7/0048;
(Continued)

(56) References Cited

U.S. PATENT DOCUMENTS

2011/0089907 A1 4/2011 Bhardwaj et al.
2019/0288504 A1* 9/2019 Götz .................. H02M 7/4835
(Continued)

FOREIGN PATENT DOCUMENTS

DE 102014110410 A1 1/2016
EP 3373407 A1 9/2018
WO 2018001465 A1 1/2018

OTHER PUBLICATIONS

English translation of EP 3373407, Feb. 12, 2020. (Year: 2020).*
PCT International Search Report and Written Opinion, PCT/EP2021/064236, Aug. 20, 2021, 14 pages.

*Primary Examiner* — Michael P Nghiem
(74) *Attorney, Agent, or Firm* — Quarles & Brady LLP; Yakov S. Sidorin

(57) ABSTRACT

An energy storage system has at least one string of N modules, with each module including an energy storage device and a switching unit configured to for either serially connect the energy storage device into the string or to provide a short circuit. The energy storage system additionally includes a controller configured to perform (during on-load operation of the ESS) the steps of:
- changing the state of at least one switching unit of a module;
- measuring a current and a voltage at the energy storage device of the module, and
- determining characteristics of the energy storage device on a basis of at least a current through the string and change over time of the voltage measured before and after change of the state of the switching unit.

14 Claims, 18 Drawing Sheets

(51) Int. Cl.

| | |
|---|---|
| ***G01R 31/389*** | (2019.01) |
| ***G01R 31/392*** | (2019.01) |
| ***H02J 7/56*** | (2026.01) |
| ***H02J 7/82*** | (2026.01) |
| ***H02J 7/90*** | (2026.01) |

(52) U.S. Cl.
CPC .............. *G01R 31/392* (2019.01); *H02J 7/56* (2026.01); *H02J 7/82* (2026.01); *H02J 7/933* (2026.01)

(58) Field of Classification Search
CPC ........ H02J 7/00712; H02J 7/0019; H02J 7/56; H02J 7/82; H02J 7/933
USPC ............................................................ 702/63
See application file for complete search history.

(56) References Cited

U.S. PATENT DOCUMENTS

| | | | | |
|---|---|---|---|---|
| 2019/0393703 | A1* | 12/2019 | Elmer | H02J 7/0024 |
| 2020/0136196 | A1 | 4/2020 | Tanemura et al. | |
| 2021/0335059 | A1* | 10/2021 | Dixit | G05B 23/0254 |

* cited by examiner

MODULAR ENERGY STORAGE SYSTEM

CROSS-REFERENCE TO RELATED APPLICATIONS

This application is a continuation of pending International Application No. PCT/EP2021/064236 filed on May 27, 2021, and now published as WO 2021/239894, which designates the United States and claims priority from European Application No. 20177203.5 filed on May 28, 2020.

BACKGROUND

1. Field of the Invention

The invention relates to an energy storage system, ESS, as well as to a method for determining characteristics of an energy storage device employed in said ESS, e.g. a battery. Such characteristics may be state of health, SOH, state of charge, SOC, or equivalent circuit diagram elements.

2. Description of Related Art

Energy storage systems, based on e.g. batteries, have a wide range of applications, such as electro mobility, portable electronic devices, or smart grid applications. Such energy storage systems include at least one energy storage device like a battery. Since batteries are complex electro-chemical systems, it is difficult to look into the internal status of the batteries. However, it is possible to estimate by measurements the state of the battery, and to predict if, how, and how long the battery can be used further on.

In order to characterize the battery dynamics, methods like electrochemical impedance spectroscopy, EIS, or the evaluation of the voltage responses due to rectangular current pulses are used.

The state of health, SOH, of a battery represents the ratio of the still available capacity of the battery to the nominal capacity of a new battery. The available capacity of a new battery is commonly obtained by measuring the total charge flow during a fully charge and/or fully discharge cycle according to the CCCV method, in which the battery is first charged (or alternatively discharged) with a constant current, CC, until a specified voltage is reached. At this point in time the voltage is kept constant, CV, allowing the current to decrease. When the current falls below a specified threshold, the battery is considered fully charged (discharged) and the charge (discharge) process is terminated. Alternatively, the rise in internal resistance is used to determine the SOH based on the EIS or based on the voltage response due to rectangular current pulses.

Since batteries commonly include serial and/or parallel hard wired battery cells, the entire battery needs to be put in maintenance mode before such kind of characterization methods are performed.

DE 10 2014 110 410 A1 discloses a method for measuring the capacitance of a module in a Modular Multilevel Converter, MMC. The MMC being suggested also to constitute an energy storage system.

US 2011/0089907 A1 discloses an in-situ battery health detector and an end-of-life detector. It is disclosed that the aging of batteries is determined by applying a pulse load to the battery and determining an impedance of the battery by measuring a voltage of the battery during the pulse load. The system assesses the health of the battery based on the impedance. It is further disclosed that the pulse load is applied to the battery, e.g., from one or more components, charger, and/or dedicated load-generating apparatus or circuit.

SUMMARY

The embodiments provide an energy storage system that allows characterization of an integrated energy storage device during operation of the ESS and to provide an operation method thereof, which determines characteristics of an energy storage device during operation of the ESS.

In an embodiment an energy storage system, ESS, is based on the concept of multilevel-converters. The ESS includes a plurality of modules interconnected to at least one string. Each module includes an energy storage device and a switching unit for switching the energy storage device in or out of the current path of a string of the ESS. The plurality of serially connected energy storage devices provides an output voltage and an output current of a string of the ESS, wherein the ESS may include one or a plurality of strings. Each string has two ends or terminals A and B, whereas the voltage between these terminals is denominated $V_{AB}$ herein.

Hence, different switching constellations of the plurality of modules and energy storage devices, where selected energy storage devices are in the current path and the remaining energy storage devices are out of the current path, result in different module configurations providing an output voltage which may change over time and which may be a staircase-shaped approximation of a sinus wave output voltage.

A subset of M modules out of N available modules of a string (M, N being integer numbers with $N>1$), may be serially connected into a common current path. Serially connected may include a connection of one or more energy storage devices with reversed polarity. The switching of energy storage devices in and out of the current path may be controlled by a controller providing switching signals to the switching units. The controller may be part of the ESS or a separate unit. It may be a central controller or a distributed controller comprising a control unit within each module. Said controller may be configured to perform during normal operation of the ESS, meaning during connection of the ESS to a load or a source, the steps of changing the serial connection by switching an energy storage device P of a module P ($P \in N$) in or out of the current path, thereby defining a changed output voltage of the string; measuring a current I through and a voltage $V_{mP}$ at the energy storage device P and determining characteristics of the energy storage device P on basis of at least current I and the change over time of said voltage $V_{mP}$ measured before and after switching the energy storage device P.

In an embodiment, different energy storage devices may be switched into the current path at different times to form a sinusoidal output voltage. As all energy storage devices of a string connected in series provide the same current, the load of an individual energy storage device depends on its on-time, which is the time a certain energy storage is connected into the current path. By evenly distributing the available modules' on-times corresponding to a particular output voltage over a certain period of time of among energy storage devices of a string, the energy storage devices may be balanced evenly. By modifying this distribution, individual energy storage devices may be unbalanced or brought into a specific operational state.

In an embodiment, four-quadrant switching units are used, which further allow switching an energy storage device with inverse polarity into the current path, thereby decreasing the absolute output voltage of the ESS. Hence, the output voltage is not only defined by the selection of the serially connected energy storage devices, but also by the polarity of each serially connected energy storage device. This additional degree of freedom allows to load a particular module or likewise energy storage device in an opposite manner compared to others, meaning that such module may be charged while other modules are discharged on the load.

In an embodiment, charging or discharging of the module to achieve the necessary measurements for determining characteristics of the energy storage device of a module may be done during on-load operation of the ESS making use of the load situation and/or the available energy of other modules.

In an embodiment, at least two energy storage devices can be connected in parallel, which does not affect the output voltage, but distributes the string current to the at least two energy storage devices. Hence, there may be a possibility to control the current amplitude through a particular energy storage device by connecting another energy storage device in parallel.

Simplified speaking, there are at least three module configuration possibilities available to generate a particular output voltage for the ESS string and to manage the load current through one or more energy storage devices.

By changing the module configuration, a current change or rather a current transition may be applied to a particular energy storage device P resulting in a respective voltage response. Said current through and the change over time of said voltage response at energy storing device P may be measured before and after the module configuration is changed in order to characterize the current status of said energy storage device P. In an embodiment, a continuous measurement of the current may be made.

An embodiment relates to a method for determining characteristics of at least an energy storage device contained in an energy storage system, ESS, during on-load operation of said ESS. The ESS includes a plurality of modules, wherein each module includes an energy storage device and a switching unit. In a first step of said method, a subset of a plurality of modules may be connected by means of the switching units into a module configuration according to which the respective energy storage devices of the subset of modules are serially connected into a current path, thereby providing an output voltage of the ESS. In a second step of said method, the module configuration is changed by switching an energy storage device P of at least one module into or out of the current path. In this way, a current change or rather a current transition may be applied to the energy storage device P, resulting in a respective voltage response. Finally, characteristics of the energy storage device P may be determined on basis of at least a measured current through and the change over time of a voltage measured at the energy storage device P before and after switching it.

The characteristics may represent the current status of said energy storage device P, such as parameters of an equivalent circuit diagram, internal resistance, SOH, SOC, temperature etc.

In an embodiment, the determination of the characteristics of the energy storage device P may be further based on its estimated SOC and/or temperature.

In an embodiment, measurement of the current I and/or the voltage $V_{mP}$ may be done locally in the module. The measurement values may be transferred e.g. by a bus, network or radio link to the controller.

The current and/or the voltage may be measured continuously and may be measured with a higher rate of measurement before, while and after a switching occurs. The measurement can take place directly at module level or at string level. When at string level, the current as a function of time within a module may be calculated depending on the timings of the switching events occurring at the respective module.

In an embodiment, the controller may be configured to determine the characteristics of the energy storage device P on basis of its estimated state of charge, SOC. The characteristics may include one or more parameters of the equivalent circuit diagram, which may be assessed based on the impedance of energy storage device P determined by measuring the voltage response triggered by the current transition. The SOC may be estimated by an ampere-hour meter, wherein a suitable starting point for the estimation may be reached by unbalancing the energy storage device P until it reaches its charge cutoff or discharge cutoff voltage.

In an embodiment, the controller may be configured to switching said energy storage device P into or out of the serially connected modules M, or repeatedly switching into or out of the serially connected modules. When repeating the switching, more data is generated which may lead to a more precise determination of the characteristics as measurement noise and imprecisions may be averaged out.

In an embodiment, the output voltage of the string is substantially sinusoidal. The current I may be substantially sinusoidal. The current through the energy storage device P, while serially connected, corresponds to sections (also called fragments) of said sinusoidal current I.

In an embodiment, the controller may be adapted to control an energy storage device P to charge or discharge to a predefined state of charge, SOC, level. Discharging may be done, by switching energy storage device P into the string, when the string of energy storage device P has to deliver an output current. When a predetermined SOC is reached, energy storage device P may no more be switched into the string, when an output current has to be delivered and/or a measurement or evaluation action may be triggered. Charging is vice-versa. In an embodiment, the controller may be adapted to control an energy storage device P in a similar way as above to charge or discharge to a predefined voltage level.

In an embodiment, the controller may be configured to control a configuration of M modules that define the output voltage of the string by means of the serially connected respective M energy storage devices to be switched to another configuration of modules comprising different modules or a module with a respective inverted serial connection of the respective energy storage device. Such switching is made at least when a step change of the output voltage is desired, wherein such switching of different module configurations over time is made such that all modules may be used over time in a balanced manner to achieve a balanced state of charge, SOC, for all energy storage devices with the exception of at least the one module P comprising the energy storage device P, which is used comparatively unbalanced to achieve a faster charging or discharging, respectively.

In an embodiment, the controller may be adapted to control based at least on the measured voltage $V_{mP}$ the switching unit of said at least one module associated with the energy storage device P. Energy storage device P may be charged from a first predefined threshold voltage V1 to a second predefined threshold value V2. Energy storage device P may also be discharged from V2 to V1. Voltage V1 may correspond to a substantially fully discharged energy storage device P. Voltage V2 may correspond to a substantially fully charged energy storage device P. The controller may be adapted to estimate, based on the measured current I over time the available storage capacity of said energy storage device P. In an embodiment, the current through an energy storage device or through the string may be measured during all time of operation, since it is safety critical to check for over current conditions or short circuits. It may be that the frequency in which the measurements are made is increased before and after the switching events in order to have an increased measurement precision and thus a better data basis for feature extraction or determining the characteristics of the modules In an embodiment, the determined characteristics of the energy storage device P may include at least one or more parameters of an equivalent circuit of the energy storage device P at one or more state of charge, SOC, levels.

In an embodiment, each energy storage device may be at least one of: a battery, a battery cell, a battery pack, a fuel cell, a stack of fuel cells, a solid-state battery, or a high-energy capacitor. By cycling the energy storage device available capacity and state of charge may also be determined. This is independent of the battery type. Such battery types may be a li-ion battery, lead-acid batteries, a solid state batteries, high temperature batteries, sulfur based battery types, high energy capacitors, lithium capacitors, lithium air batteries or others.

The switching unit may include at least one of: a three pole switch, a half bridge, wherein a half-bridge includes two switches, two half-bridges; or one or two full bridges, wherein each full bridge includes four switches. The switching units may include a configuration of switches which do not form a half bridge or a full bridge, but still may connect neighboring energy storage devices in series or in parallel.

Further, the switch units may also have one or two battery switches at at least one of the poles of the energy storage device in order to disconnect it with a higher degree of safety. Some safety standards require such an additional degree of safety which could also be reached with one or two fuses at at least one of the poles. The switches could be transistors (MOSFET, bipolar, SiC, GaN, JFET), IGBTs, Thyristors, solid state relays or electromechanical relays or a combination thereof.

In an embodiment, each module of the N modules may further include at least one temperature sensor to measure the temperature at the respective energy storage device.

In an embodiment, the energy storage system may include three strings to generate a three phase output voltage, wherein the three strings may be connected in star or delta configuration.

In an embodiment, the energy storage system may include two strings which have terminals connected to a single point to generate a three phase output voltage wherein the connected terminals and the two not connected terminals form the three potentials of a three phase output voltage.

In an embodiment, the energy storage system may include one or two strings to create a two phase output voltage as it might be used for railway systems, In an embodiment, an arbitrary number of strings may be provided to create an arbitrary number of output voltage phases which may be used e.g. in a motor with the same arbitrary number of strings or which may be used to connect two different AC grids, whereas these AC grids preferably have a number of one, two or three phases (so usually 2 to 6 strings may be used to connect different AC grids, e.g. 50 Hz and 60 Hz grids together).

In an embodiment, at least one string is configured to provide an independent DC voltage whereas this DC voltage may be pulse-width modulated.

In an embodiment, at least at one terminal of the string may include a filter, said filter may include an inductance and/or a capacitor forming the filter types L, LC or LCL filter, whereas especially in the one phase case coupled inductors may be used for the two terminals of the string.

An embodiment relates to a method of determining characteristics of energy storage devices contained in an energy storage system, ESS, during on-load operation of said ESS. The ESS may include a plurality of modules, each module including an energy storage device and a switching unit. The method includes the steps of connecting by means of the switching units a subset M of said plurality of modules into a module configuration according to which the respective energy storage devices of the subset of modules are serially connected into a current path to provide an output voltage of said ESS; altering the module configuration by switching the energy storage device P of at least one module into or out of the current path; measuring a current I through and a voltage $V_{mP}$ at said energy storage device P; and determining characteristics of the energy storage device P on basis of at least current I and the change over time of said voltage $V_{mP}$ measured before and after switching the energy storage device P.

The ESS may include at least one string of N modules. N may be an integer with N>1. Each module includes at least one input and at least one output. In the following, the individual modules are numbered by the integer n with 0<n<N.

The at least one output of the (n)-th module may be connected to the at least one input of the (n+1)th module for each integer n with 0<n<N. This means, that a module may be connected to the next module in numbering, thus forming a chain or string of modules. Each module of the N modules includes a switching unit and an energy storage device.

By interconnecting the modules, M energy storage devices of N modules may be serially connected by means of the switching units. Here, M is a subset of the N modules with 1≤M≤N. The M serially connected modules generate an output voltage of the string.

In an embodiment, a controller may be configured to modify the serial connection by switching the energy storage device P of module P such, that it is serially connected in the string. Otherwise, the module P may provide a bridge from its at least one input to its at least one output. Module P may be one of modules N. Said modification of the serial connection may result in a modified output voltage of the string.

The controller may further be configured, to measure a current I and a voltage $V_{mP}$ at said energy storage device P, and determine characteristics of the energy storage device P on basis of at least of the current I and a change over time of said voltage $V_{mP}$ measured before and after switching the energy storage device P. In some aspects, measurement of the current I and/or the voltage $V_{mP}$ may be done locally in the module. The measurement values may be transferred e.g. by a bus, network or radio link tom the controller.

In an embodiment of the method, the characteristics of the energy storage device P include at least one of: one or more parameters of an electric equivalent circuit diagram including the internal resistance, or state of health, SOH, of energy storage device P.

In an embodiment of the method, determining characteristics of the energy storage device P is further based on its estimated state of charge, SOC.

In an embodiment of the method, the SOC is estimated by integrating the current through the energy storage device P and dividing the integrated current through an available capacity $C_x$ of the energy storage device P. This value may be subtracted from the previous SOC estimation. This may be continuously done to track the SOC. A suitable starting point for SOC estimation may be a fully charged battery (SOC ca. 100%) or a fully discharged battery (SOC ca. 0%).

Alternatively the module P may be unloaded for a time preferably longer than 1 minute, for a more precise estimation longer and up to 12 hours to determine the SOC from the energy storage device via its OCV-SOC relation.

In an embodiment of the method, determining characteristics of the energy storage device P may further be based on an assessed temperature of the energy storage device P.

According to an embodiment of the method, said current I is measured at module level to obtain the current $I_{mP}$ through the energy storage device P.

In an embodiment of the method, determining characteristics of the energy storage device P further includes determining the available capacity $C_x$ of the energy storage device P by applying at least one substantially fully discharge and/or charge cycle with the energy storage device P. To obtain the total charge transfer during the at least one discharge or charge cycle, the current I may be integrated.

In an embodiment of the method, the SOH is estimated by at least one of determining a decrease of the available capacity $C_x$ by dividing of the available capacity $C_x$ with a nominal capacity $C_N$ of the new energy storage device P, or by determining an increase of the internal resistance by dividing the actual internal resistance to a nominal internal resistance of the new energy storage device P.

In an embodiment of the method, the current through the energy storage device P being sections or fragments of a sine wave current used to maintaining the power requirements from a grid or a load during on-load operation of the ESS.

The term on-load operation of the ESS as used herein means that the ESS is in a state of operation during which it delivers power to a grid or to a load (e.g. an electrical machine) or during which it receives power from the grid or from another power source.

BRIEF DESCRIPTION OF THE DRAWINGS

In the following, the invention will be described by way of example, without limitation of the general inventive concept, on examples of embodiment and with reference to the drawings.

Figure 1A:
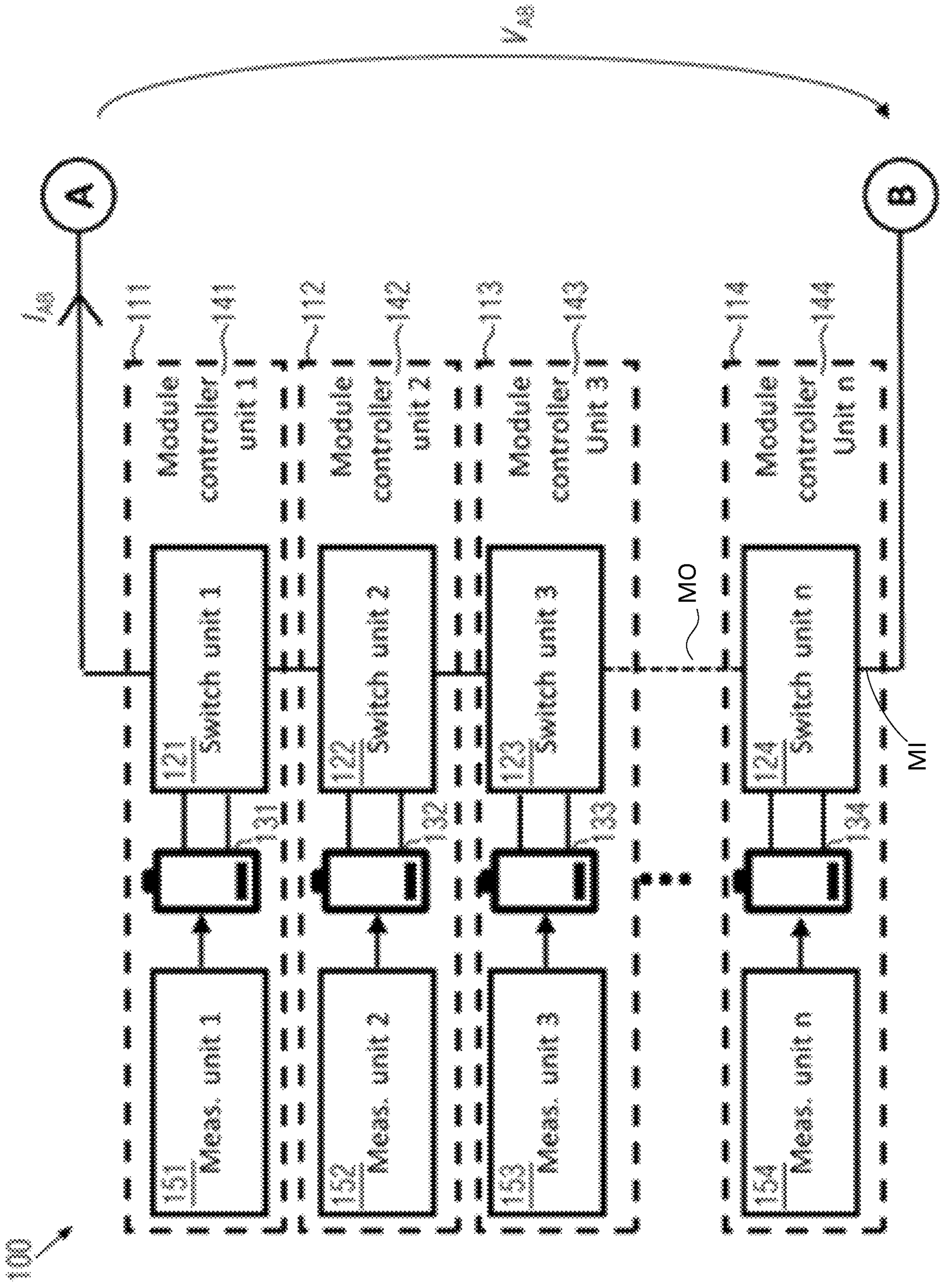
FIG. 1A shows a basic structure of an energy storage system, ESS, in an embodiment.

Generally, the drawings are not to scale. Like elements and components are referred to by like labels and numerals. For the simplicity of illustrations, not all elements and components depicted and labeled in one drawing are necessarily labels in another drawing even if these elements and components appear in such other drawing.

While various modifications and alternative forms, of implementation of the idea of the invention are within the scope of the invention, specific embodiments thereof are shown by way of example in the drawings and are described below in detail. It should be understood, however, that the drawings and related detailed description are not intended to limit the implementation of the idea of the invention to the particular form disclosed in this application, but on the contrary, the intention is to cover all modifications, equivalents and alternatives falling within the spirit and scope of the present invention as defined by the appended claims.

DETAILED DESCRIPTION

FIG. 1A shows a string of N modules, with an integer N>1, of an energy storage system, ESS, which, in an embodiment, generates a stepwise output voltage $V_{AB}$. The ESS is constructed according to a modular multilevel converter, MMC, while being equipped with a plurality of integrated energy storage devices (131-134). Throughout the description, the term energy storage device includes preferably a li-ion based battery cell or a battery module, wherein the battery module consisting of at least two or more parallel or serial hard wired battery cells.

The ESS includes a string (100) including a plurality of modules N (111-114) connected in series. Each module (111-114) includes a switching unit (121-124) configured to selectively put the respective energy storage device (131-134) in or out the current path, which generates string output voltage $V_{AB}$ whereas the subset of modules in the current path will be denominated as M in the following. Each module further includes a respective module controller unit (141-144) configured to control the switching unit (121-124) of the respective module (111-114). Furthermore, each of the modules (111-114) includes a measurement unit (151-154) to measure at least a voltage at the respective module. Preferably, the module measurement unit may also measure the current through the energy storing device locally on a module level. In an embodiment, each measurement unit further includes one or more temperature sensors to measure the temperature at the respective energy storage device (131-134). While the measurement unit (151-154) is shown as a separate component, a skilled person would understand that the measurement unit could be integrated into the respective module controller unit (141-144). An input and an output of a given module are generally denoted MI an MO, as shown in the example of module 114.

Figure 1B:
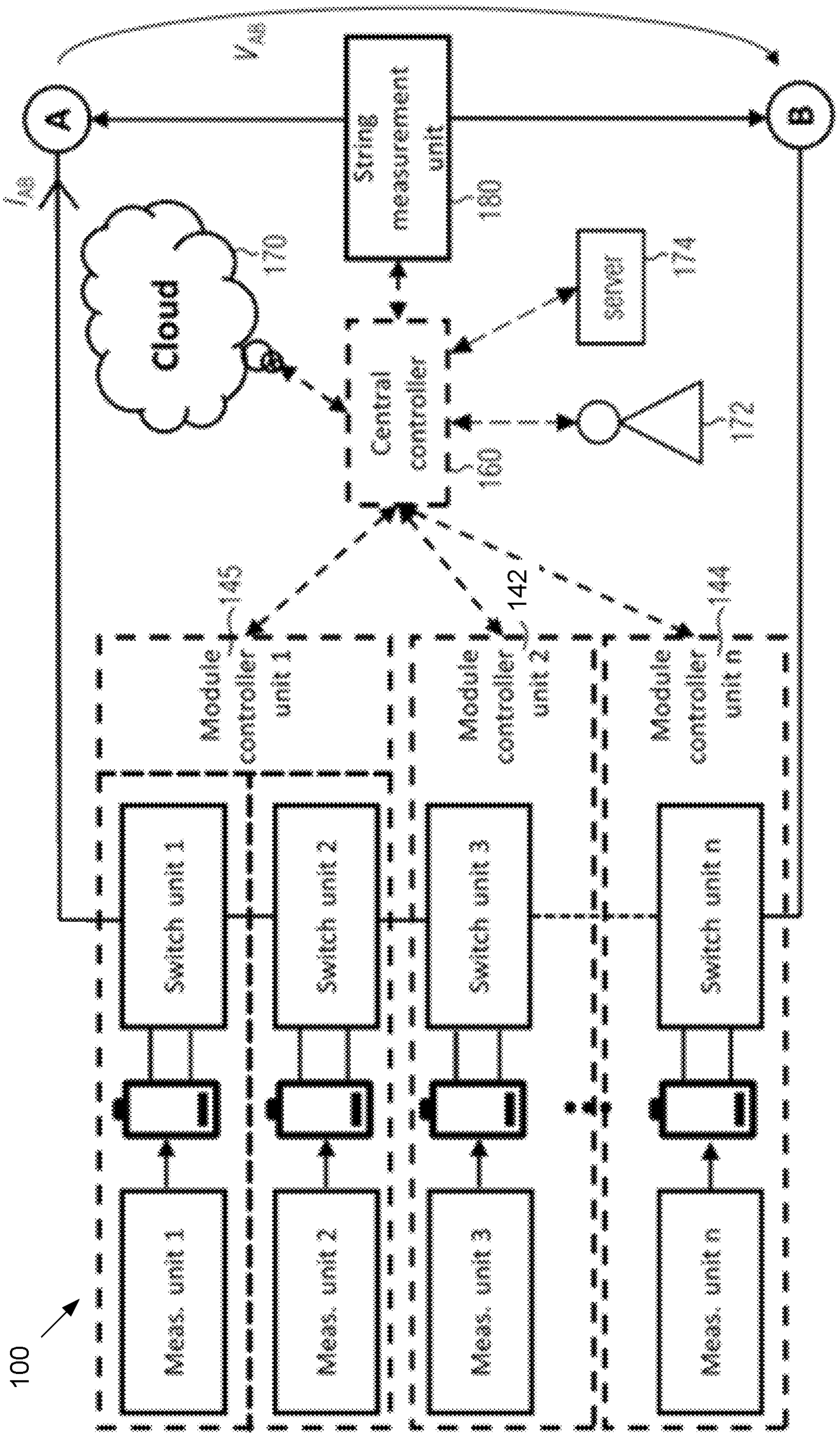
FIG. 1B shows a basic structure of an energy storage system, ESS, according to another embodiment.

FIG. 1B shows a structure of an ESS. In an embodiment which contains a central controller (160) comprising a plurality of module controller units (142, 144, 145). The system further includes a string measurement unit (180) associated with the central controller (160). While the string measurement unit (180) is shown as a separate component, a skilled person would understand that the string measurement unit (180) could be integrated into the central controller (160). The string measurement unit (180) measures the overall string (100) current $I_{AB}$ and string output $V_{AB}$ through and at the string (100) of the modules. In some aspects, a module controller unit (145) may be associated with more than one switching units and energy storage devices. The ESS may further include a cloud server (170), which may run some calculations and may store data associated with the ESS. The central controller (160) may exchange information with the module controller unit (141-145), with the string measurement unit (180) and/or with the cloud server (170).

In an embodiment, the central controller (160) may be located in the ESS, or alternatively may be located at a remote location. In some aspects, the ESS may include a communication interface to communicate via a communication network, such as LAN, WLAN, Bluetooth, etc., with a remote server (174) or cloud (170). In an embodiment, the central controller (160) may collect the measured data and provide them to the remote server (174) or to the cloud (170) via the communication network.

In some aspects, a remote user (172) may remotely control the operations performed on the central controller (160), for example by employing a software routine on it. Hence, the operation of the ESS may be changed during operation of the ESS, for example, in an electric vehicle, such, that a particular energy storage device (131-134) may be characterized as described herein. The results and/or measurement data may then be sent back to the remote user (172) via the communication network. Alternatively, the results and/or measurement data may be sent, via the communication network, to a particular remote server (174) being associated with a service provider having interest in the current state of the ESS via the communication network, such as an original equipment manufacturer, a supplier, a of consumer, an insurance company, etc. As in FIG. 1A, each of the modules has a corresponding input (MI) and output (MO), not shown for simplicity of illustration.

Figure 2A:
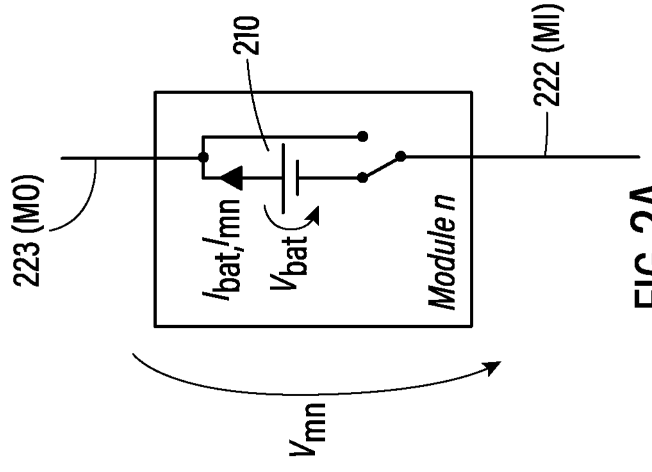
FIG. 2A to 2C illustrates different types of switching units allowing a serial connection possibility of modules and energy storage devices.
Figure 2C:
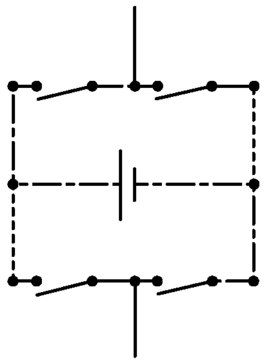
Figure 2B:
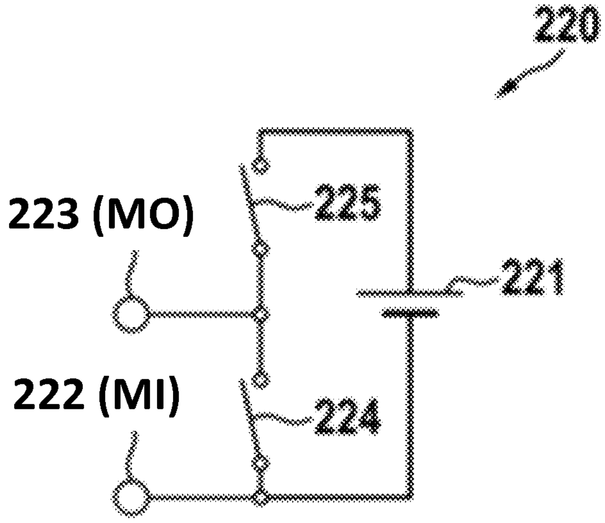

FIGS. 2A to 2C illustrate different types of switching units (121-124), allowing to achieve a serial connection of a plurality of energy storage devices (131-134) to generate the overall current $I_{AB}$ path of the string (100) of the plurality of modules (111-114). FIGS. 2A and 2B each show an implementation applicable to a two-quadrant module to either bypass the energy storage device or to put same into the current path, thereby increasing the string output voltage by the voltage of the energy storage device $V_{bat}$. The corresponding modules have one input and one output. FIG. 2B shows a simple embodiment of a switching unit 220. It has an input (222, MI) and an output (223, MO). A battery (221) may be connected between input and output of the corresponding module if the series switch (225) is closed and the parallel switch (224) is open. The battery is disconnected, if the series switch (225) is open. Further, the parallel switch (224) is closed to provide a direct connection (short circuit) between input and output. It should be avoided to close both switches at the same time as this may lead to a short circuit of the battery. FIG. 2C illustrates a four-quadrant module represented by a full bridge providing the function of a two-quadrant module, but additionally allowing the energy storage device (210) to be switched inversely into the overall current path of the string (100), thereby decreasing the string output voltage $V_{AB}$ by $V_{bat}$, whereas $V_{bat}$ is the voltage of one energy storage device of a module. FIG. 2C shows by the dashed lines the current path taken between corresponding module input and module output through the module in case the energy storage device (210) is put serially into the current path and shows by the dotted lines the current path in case of an inverse serial connection. Hence, a string output voltage $V_{AB}$ in a range between $-M \cdot V_{bat}$ to $M \cdot V_{bat}$ may be generated, whereby M is the number of serially connected energy storage devices (131-134).

Figure 3B:
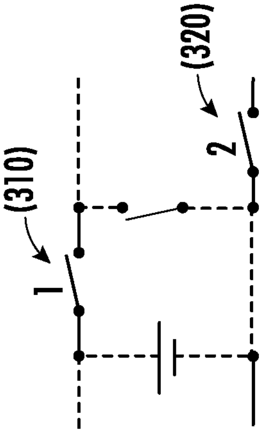
FIG. 3B to 3E illustrates different types of switching units allowing a serial and/or parallel connection possibility of modules and energy storage devices.
Figure 3C:
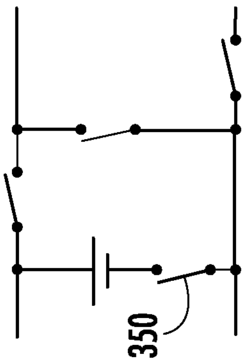
Figure 3D:
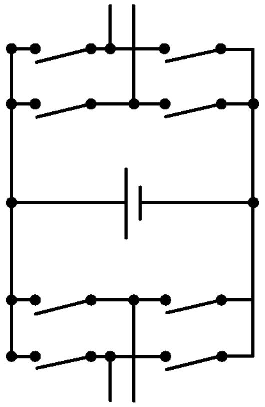
Figure 3E:
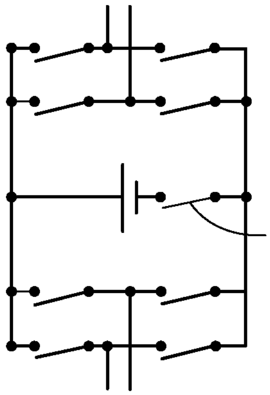
Figure 3A:
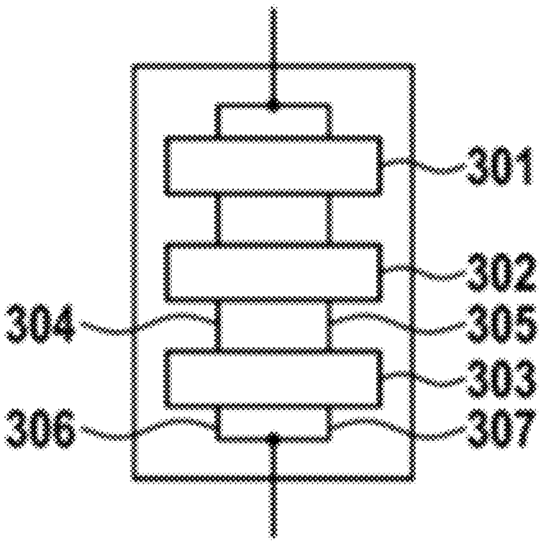
FIG. 3A shows a module structure with parallel connection possibility in an embodiment.

FIG. 3A illustrates a string configuration according to which the plurality of modules (301, 302, 303) have two inputs (306, 307) and two outputs (304, 305) to achieve not only serial but also parallel connectivity of the modules. Such multiple input multiple out, MIMO, modules may replace the single input single output modules (111-114) as shown in FIG. 1A.

FIGS. 3B to 3E illustrate different types of switching units (121-124) that may be employed in the MIMO modules shown in FIG. 3A. In particular, FIG. 3B shows by means of the dashed lines a two-quadrant MIMO module in a state where the energy storage device is put serially into the current path. The energy storage device may be put by closing switches 1 (310) and 2 (320) in a parallel manner into the current path. FIG. 3C shows another type of a two-quadrant module which may be employed in the MIMO module. FIGS. 3D and 3E, each show a four-quadrant MIMO module represented by two full bridges providing the function of a two-quadrant MIMO module, but additionally allowing the energy storage device to be switched inverse into the current path in case of an inverse parallel connection. An illustration of the current path taken through the modules of FIGS. 3C to 3D depending on the switching states is omitted for the sake of clarity. The switching units illustrated in FIGS. 3C and 3E may additionally include a battery switch (350, 351) to separate the energy storage device from the current path independently of the switching state of the other switches within the respective switching unit. These modules have two inputs and two outputs.

Figure 4:
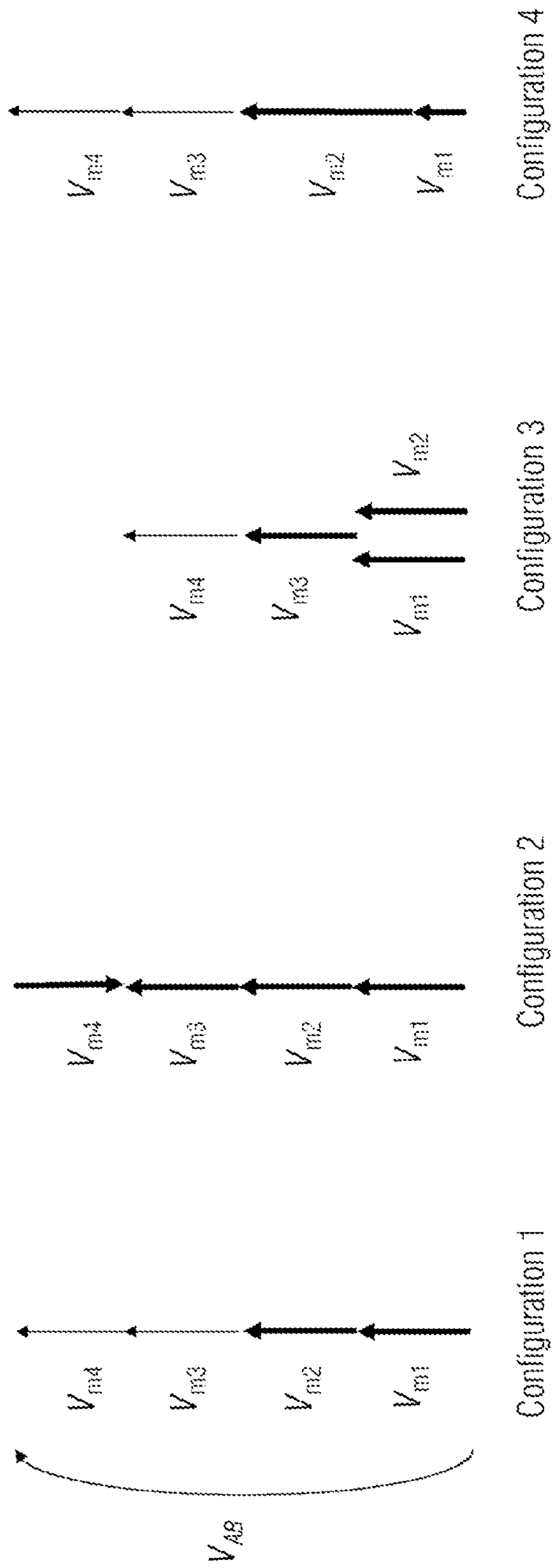
FIG. 4 shows different module configuration sets and their effects to the string output voltage.

FIG. 4 illustrates by some examples the effect of different module configurations on the string output voltage $V_{AB}$. In these examples it is assumed that four modules are available and that each module may be switched between four different states, namely serial, parallel, bypass and inverse.

According to configuration 1, module 1 and module 2 are serially connected and generate an output voltage $2 \cdot V_{bat}$. Modules 3 and 4 are bypassed.

While the module voltage is assumed to be positive, an inversely connected module may be illustrated with a negative voltage contribution, as discussed in the following.

In configuration 2, modules 1 to 3 are serially connected and generate an output voltage $3 \cdot V_{bat}$. Module 4 is inverse serially connected and reduces the output voltage by $V_{bat}$ to $2 \cdot V_{bat}$. As a result, an output voltage equal to the output voltage of configuration 1 is generated albeit using a different module configuration.

According to configuration 3, modules 1 and 2 are connected in a parallel and share the same absolute but halved string current. In addition, module 3 is serially connected to modules 1 and 2 and, together, generate an output voltage $2 \cdot V_{bat}$. Module 4 is bypassed.

According to configuration 4, module 1 and module 2 are serially connected and generate an output voltage $2 \cdot V_{bat}$, whereby the voltage of module 1 is less than the voltage of module 2. Modules 3 and 4 are bypassed.

Figure 5A:
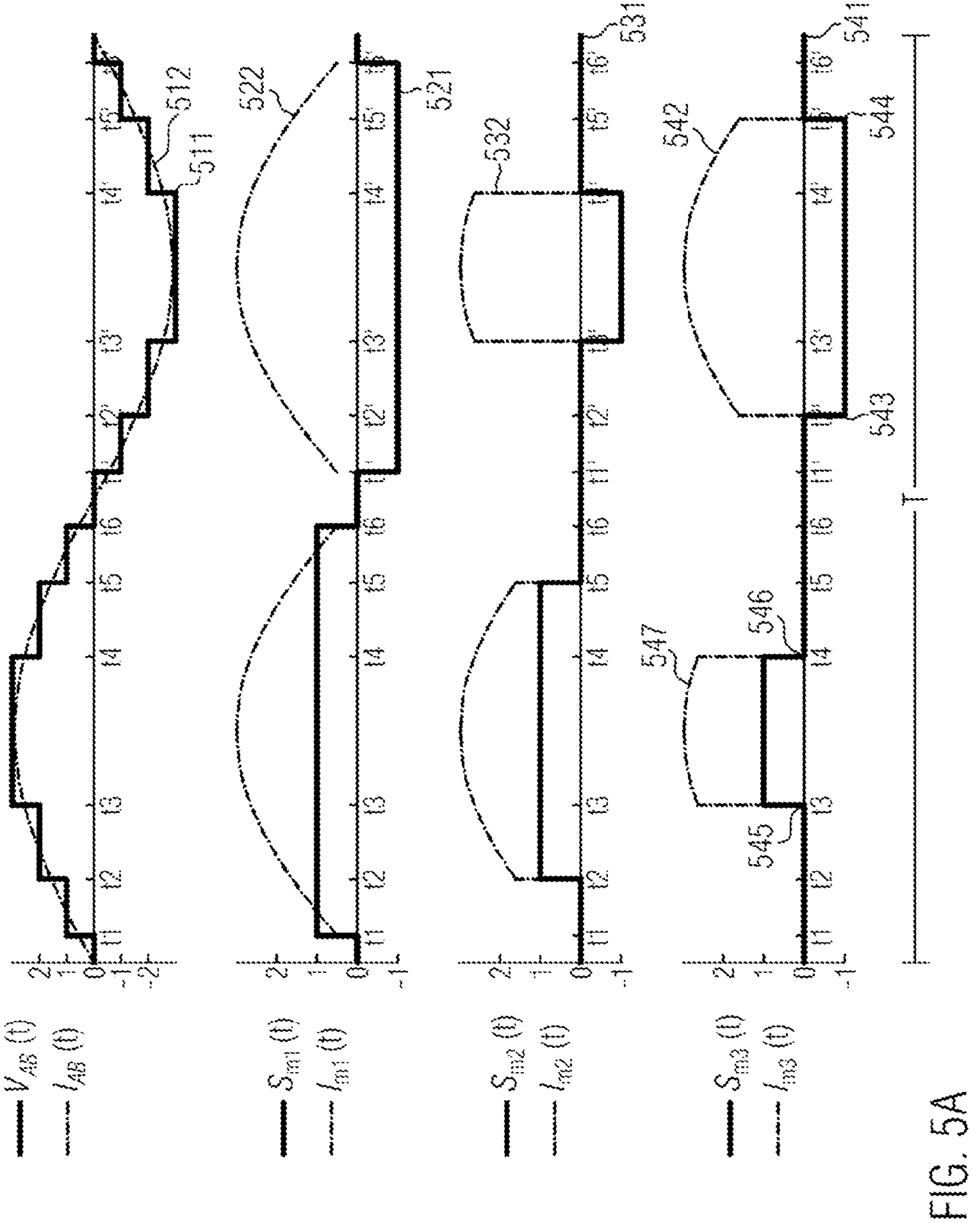
FIG. 5A illustrates an exemplary sequence of different module configurations over time to generate a sinusoidal string output voltage.

FIG. 5A illustrates an exemplary sequence of different module configurations over time to generate an approximately sinusoidal string output voltage $V_{AB}$ (t) by a stepwise/staircase output voltage typically needed for grid or motor applications.

On top of FIG. 5A, the string output voltage $V_{AB}$ in units of $V_{bat}$ (511) is illustrated over time by a solid stepped line and the resultant current through the string (512) is schematically illustrated by means of dash-dotted lines. The current through the string (512) is typically smoothed by an inductive load or filter and may have a phase shift towards the string output voltage depending on the used current controller, filter and the load. The three lower diagrams show by means of a solid line the changing module switching states $s_{mn}$ (521, 531, 541) of the respective three modules, which may be serial (=1), bypass (=0) and inverse (−1), of three particular modules together synthesizing the string output voltage (511) of FIG. 5A. Moreover, the diagrams illustrate by dashed-dotted lines the respective currents $I_{mn}$ (522, 532, 542) seen by the three modules. Each current through a respective module corresponds to a fragment of the sinusoidal string current (512) in case the respective module is not bypassed. The current $I_{mn}$ indicates the current through module n and switching state $s_{mn}$ indicates the switching state of module n, with n being and integer with 0<n<N.

Each time a module is put into or out the current path, a respective positive or negative current transition (543-546) is effected at the module. If the switching occurs in two consecutive steps (545, 546) with reversed polarity, a current pulse (547) is generated at the module. In case of MIMO modules, a current transition may be effected by switching modules in parallel. The current amplitude of the positive or negative current transition may be set by measuring the string current and determine, by comparing the string current with a predefined current amplitude, a particular point in time the positive or negative transition is to be applied.

Figure 5B:
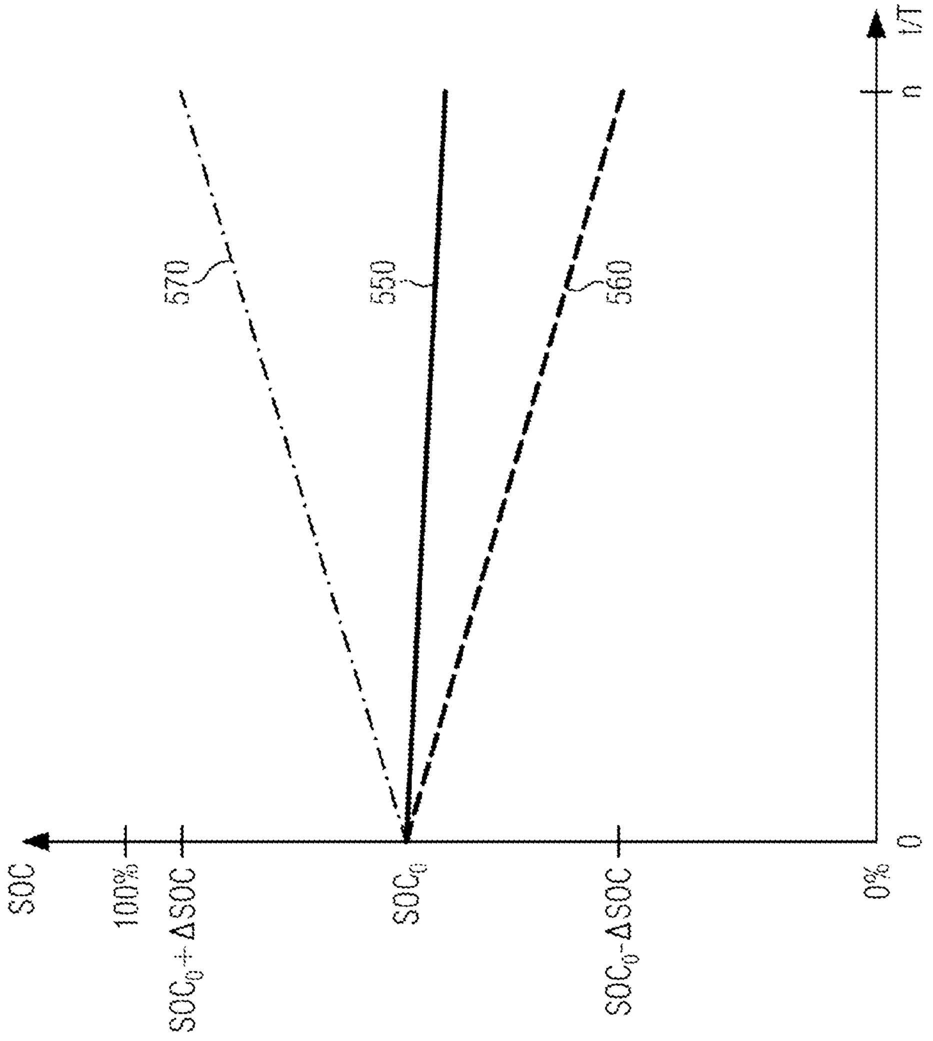
FIG. 5B shows the impact to the SOC of the exemplary sequence of the different module configurations shown in FIG. 5A over a plurality of periods.

The module configurations may be selected in a manner that a subset of the modules or all modules within the string (100) are loaded substantially even, such, that their SOC is maintained at a very similar level to each other, hereinafter referred to as balancing. For example, FIG. 5B shows by solid lines the substantially uniform SOC of modules 2 and 3 (550) over time caused by the uniform and balanced loading of the modules over several sine wave periods.

In an embodiment, at least one is loaded intentionally unbalanced to determine certain characteristics of its respective energy storage device during operation of the ESS at one or more predefined SOC levels. For example, module 1 is more heavily loaded during the shown single sine period compared to module 2 and 3 in FIG. 5A. Simplified speaking, if the particular module is determined to be more heavily loaded, said module may be switched on first and switched off last or it may be switched on more frequently compared to other modules. In addition, the module may be connected in serial, but not be connected in parallel. On the contrary, if the particular module is determined to be less heavily loaded, said module may be switched on last and switched off first or it may be switched on less frequently compared to other modules. In addition, the module may be connected in parallel. Hence, the SOC of module 1 will change faster than the SOC of modules 2 and 3. FIG. 5B illustrates by dashed lines the SOC over time caused by unbalancing of module 1 (560) over several sine wave periods.

In an embodiment, the module configurations may be selected in manner that at least two modules may be loaded in the opposite direction to accelerate the time needed to unbalance at least one module to a predefined SOC level. For example, if there are more modules available then needed for holding the ESS operational, a module may also work against the other, balanced, modules. So when the balanced modules are being discharged, they may not only be discharged into the grid or load but also into said module. For charging the inverse applies. As another example, if there are two modules more available then needed for holding the ESS operational, one module may be intentionally discharged while the other module is intentionally charged by the load removed from said first module. FIG. 5B illustrates by dashed-dotted lines the SOC over time of a module 4 (570) caused by unbalancing of module 4 inverse to module 1 (560) over several sine wave periods. This is in particular advantageous, in case, the balanced modules have a higher SOC (550) and consequently also a higher voltage, such, that the probability that the unbalanced modules are needed for operation of the ESS being low. Hence, loading a module to an unbalanced SOC level may be accelerated.

Figure 5C:
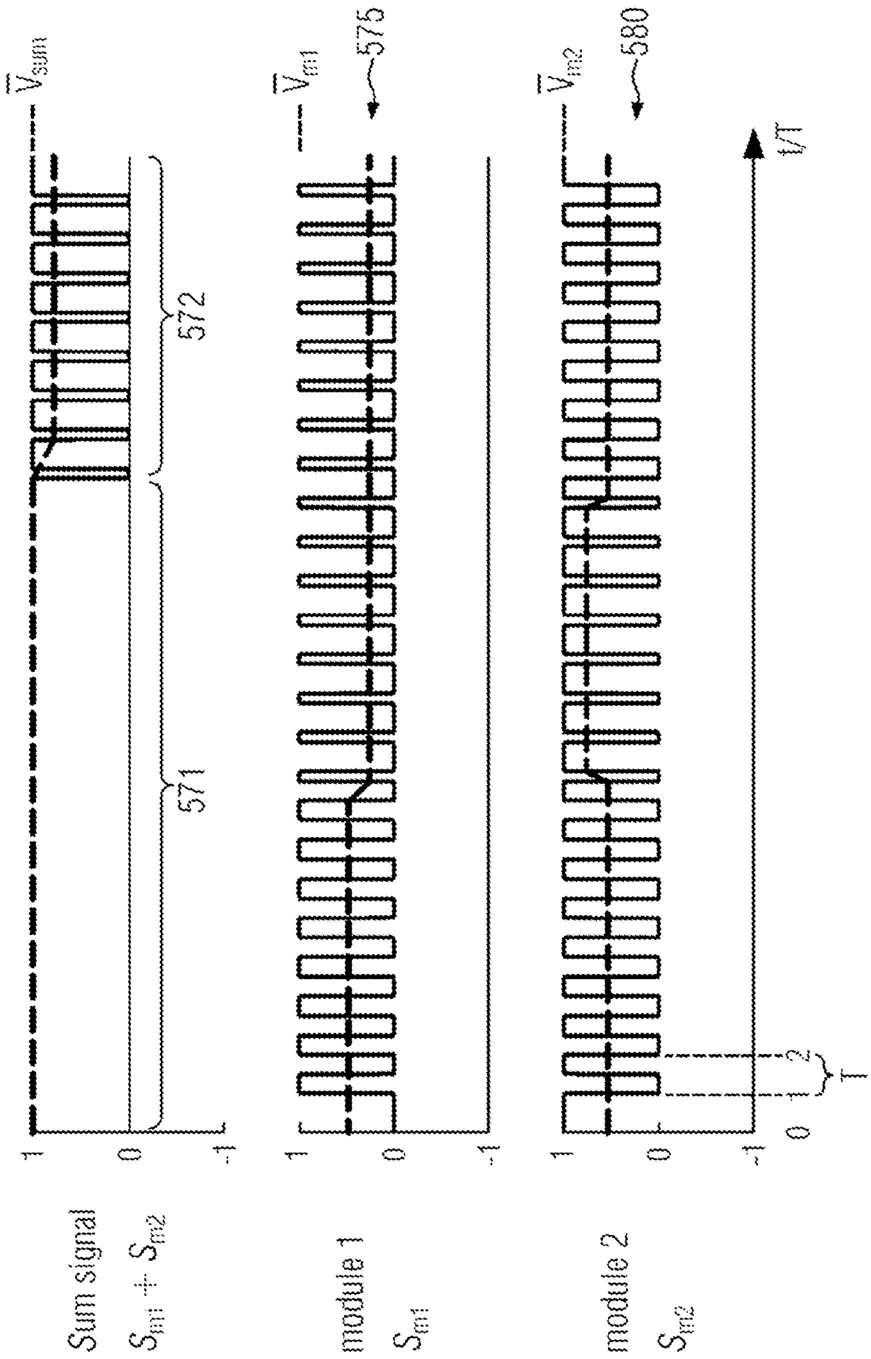
FIG. 5C shows pulse pattern shared between two modules and the result on the output waveform.

According to another embodiment, a module may be pulsed in a much shorter period to generate a pulse-width modulation, PWM, signal, which smoothens the staircase approach of the desired sine wave voltage of the string output (511). In some embodiments, two or more modules may pulse against or with each other to generate a desired output voltage. For example, FIG. 5C shows an example where two or more modules pulse (575, 580) with each other, without changing the output function of the string or likewise the sum signal (571) of both modules. According to another embodiment, interleaved pulsing may be used to generate a PWM signal without the need for each module to pulse in the full PWM frequency. Hence, from a system point of view, the PWM frequency (572) seems to be higher than the PWM frequency of each module. In an embodiment, the current amplitude may be set based on the right timing in relation to the load current on the string, but may also by setting the number of modules working in parallel. The averaged voltage resultant from the PWM signals within a PWM period for each, module 1, 2 and the sum signal, are illustrated over several PWM periods in dashed lines in FIG. 5C.

In an embodiment, the abbreviation P is used to refer to a module, which is intentionally unbalanced to characterize the respective energy storage device P thereof.

It was shown that positive or negative current transitions can be generated by putting an energy storage devices into or out of the current path of the string. Further, it was shown that a particular energy storage device within a module can be intentionally unbalanced to an SOC different to the SOC of the other modules.

In an embodiment, said two control options are combined to characterize the energy storage device P. Simplified speaking, the energy storage device P is characterized by the voltage response triggered from a current transition or current pulse reflecting a certain load change. Based on said voltage response, one or more characteristics including the elements of an equivalent circuit diagram, the internal resistance, and the SOH may be determined. Since, the elements of an equivalent circuit diagram and the SOH typically depend on the SOC level, the energy storage device P is "unbalanced" to reach several SOC levels. Respective measurements may thus be carried out at different SOC levels of the energy storage device P, thereby generating SOC level dependent parameters for the equivalent circuit diagram.

Parameters carried out by the respective measurements may be used to update models describing the energy storage devices, such as a digital twin, an SOC estimation model, or modules for estimating the actual aging of the energy storage devices in an expanded parameter space. Parameters may include values of the elements of an equivalent circuit diagram and/or values describing the functional dependency of the elements of an equivalent circuit diagram on the SOC, temperature, and/or current intensity. The parameters and models may be used to predict maintenance, e.g., replacement requirements, warranty cases or the lifetime of an energy storage device.

Figure 6A:
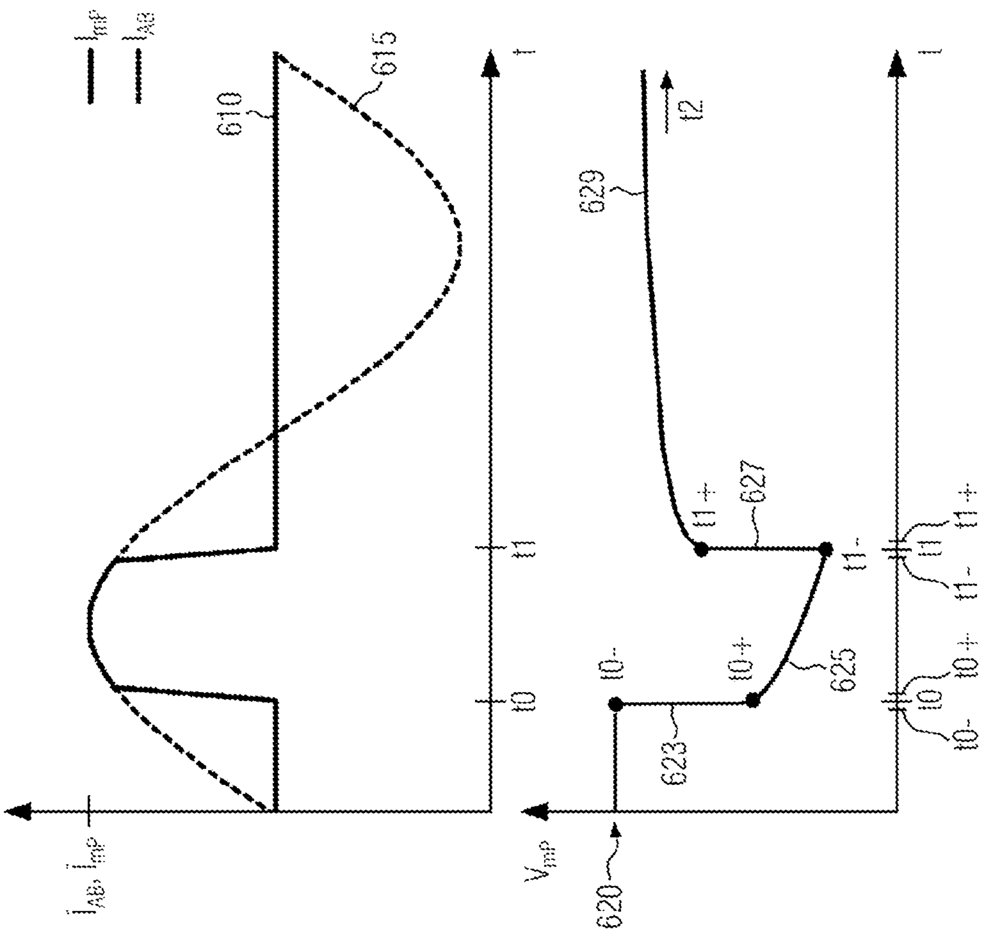
FIG. 6A shows a time sequence of a measured voltage response $V_{mP}$ at an energy storage device triggered by two consecutive current transitions of it with different polarities.

In more detail, FIG. 6A shows a time sequence of the measured voltage response $V_{mP}$ (620) at an energy storage device P triggered by two consecutive current transitions (612, 614) of it with different polarities at time t0 and t1. The current (610) is a fragment of the sinusoidal string current $I_{AB}$ (615) represented by the solid line during the period t0 to t1.

Based on the voltage response shown in the lower part of FIG. 6A, one or more elements of an equivalent circuit diagram of energy storage device P may be determined.

Figure 7:
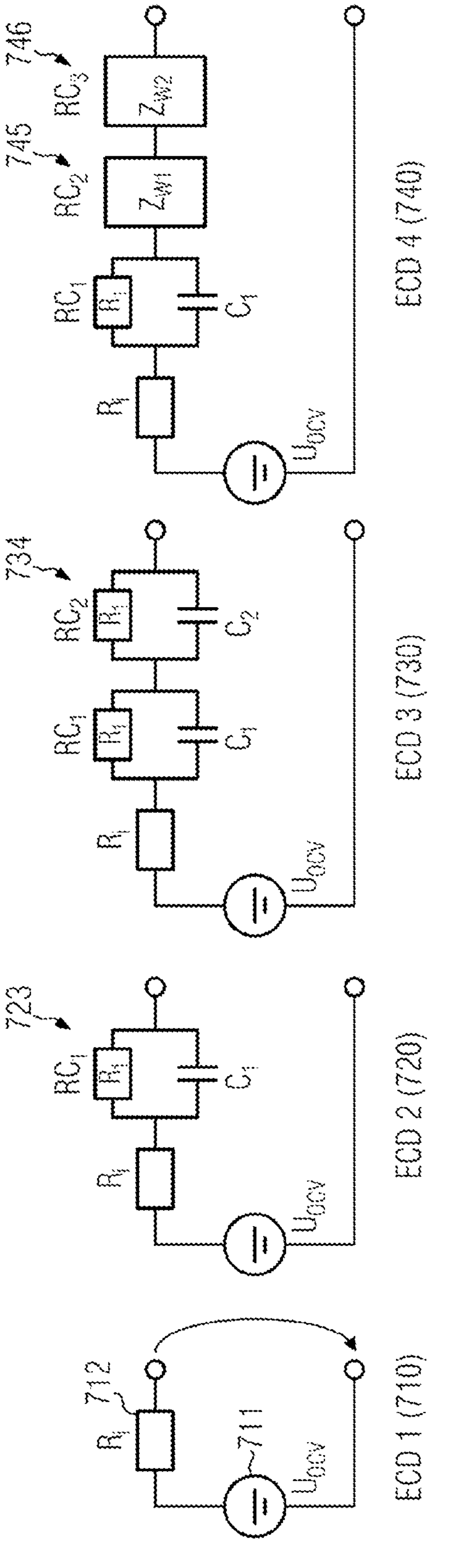
FIG. 7 illustrates examples of equivalent circuit diagrams of battery cells.

FIG. 7 illustrates examples of equivalent circuit diagrams of battery cells. A first equivalent circuit diagram (710) consists of a voltage source (711), the so called open circuit voltage, OCV, and an internal resistance (712). Alternatively, a battery cell is modeled more precisely with additional serially connected RC elements (723, 734) as shown by the equivalent circuit diagrams 2 to 4 (720, 730, 740). Equivalent circuit diagram 4 (720) additionally includes two Warburg elements (745, 746) representing an even more precise battery model. The elements of the equivalent circuit diagrams may dependent on at least the SOC, the temperature, and the current intensity of the battery.

Referring back to FIG. 6A, internal resistance (712) may be determined by dividing the voltage drop (623) triggered by current transition (612) at t0 through the measured magnitude of said current transition. The voltage drop (623) itself may be measured the voltage at the energy storage device just before (t0−) and just after (t0+) the current transition (612) is applied.

Alternatively or additionally, the internal resistance (712) may be determined based on the voltage rise (627) between t1− (626) and t1+ (628) triggered by current transition (614) with reversed polarity. In an embodiment, the internal resistance (712) is determined by obtaining the mean value of both said determinations to achieve a higher parameter accuracy.

The different and overlaid gradients of voltage drop (625) between t0+ and t1− may be used to identify the RC (723, 734) and Warburg (745, 746) elements of one of the equivalent circuit diagrams 2 to 4. The different and overlaid gradients in the relaxation process (629) may, instead or additionally be used to identify said RC (723, 734) and Warburg (745, 746) elements.

A new OCV voltage (711) may be assessed after the negative current transition (614) is applied and the capacities of the energy storage device have been substantially discharged. Such state is typically reached at the end of relaxation process at time t2. The relaxation process may take up more than 24 hours.

In an embodiment, mathematical methods, such as at least one of: curve fitting, neuronal networks, machine learning or support vector machines may be used to determine the elements of the equivalent circuit diagrams (710, 720, 730, 740) based on these measurements. The multiple execution of the measurements allows measurement errors to be minimized by averaging the measured values.

In the above it has been shown how one or more parameters of the equivalent circuit diagram may be determined based on the measured voltage response triggered by a positive and/or negative current transition. As previously discussed, the one or more values of the equivalent circuit diagrams are SOC dependent.

In some embodiments, not only the current and voltage through the energy storage device may be taken into account to determine one or more parameters, but also the temperature at which the respective measurement has been carried out.

Figure 6B:
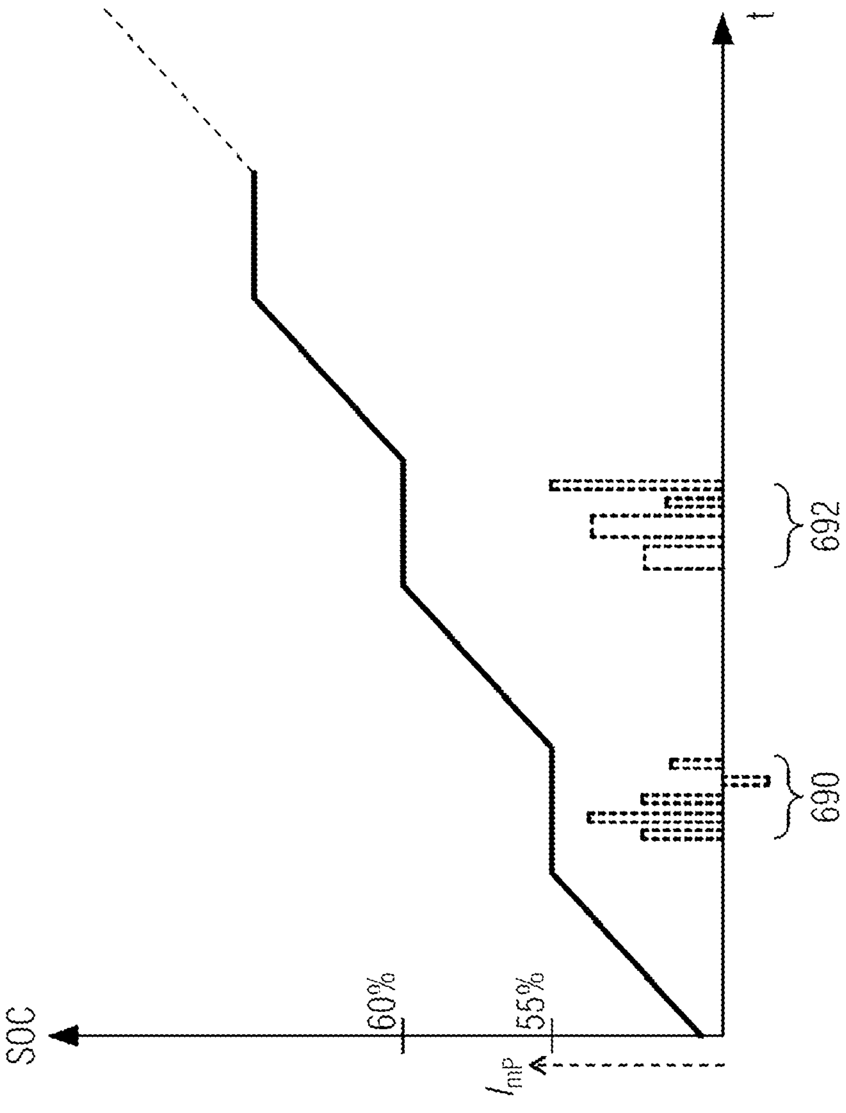
FIG. 6B shows a time sequence of measurement cycles at different SOC levels of energy storage device P.

In some embodiments, not only the current and voltage through the energy storage device may be taken into account to determine one or more parameters, but also the SOC at which the respective measurement has been carried out. In an embodiment, the measurements may be carried out at 5% SOC intervals to increase the model accuracy of the SOC-dependent parameters. FIG. 6B shows how the energy storage device P is charged to predefined SOC levels (55%, 60%, etc.). After a predefined SOC level is reached, the respective measurements or likewise measurement cycles may be carried out. In particular, FIG. 6B shows by dashed lines an example of different current transitions or likewise current pulses (690, 692) with different current amplitudes and pulse durations applied to the energy storage device at 55% and 60% SOC to parameterize the equivalent circuit of energy storage device P. The switching of module P may be performed more than once and repeatedly for each measuring cycle. It is further possible to load energy storage device P with current pulses of different polarity and different time periods. These pulse patterns may be repeatedly applied to energy storage device P in order to compensate for measurement errors through averaging or curve fitting methods. By varying the pulse patterns the amount of information which may be extracted from the time series measurements increases. Most information may be extracted if the pulse patterns resemble a quasi-noise pattern, where the pulse duration, polarity of pulses and amplitude of pulses at least seem to not have a regularity or dependency on each other. Since the SOC may be not directly measurable, it may be estimated as shown below.

The SOC represents the remaining capacity related to the available capacity $C_x$ of the energy storage device. The SOC may be estimated by means of an ampere-hour meter according to $$SOC(t) = SOC(t-1) + \int_{t-1}^{t} \frac{i(t)}{C_x} dt.$$

Figure 8:
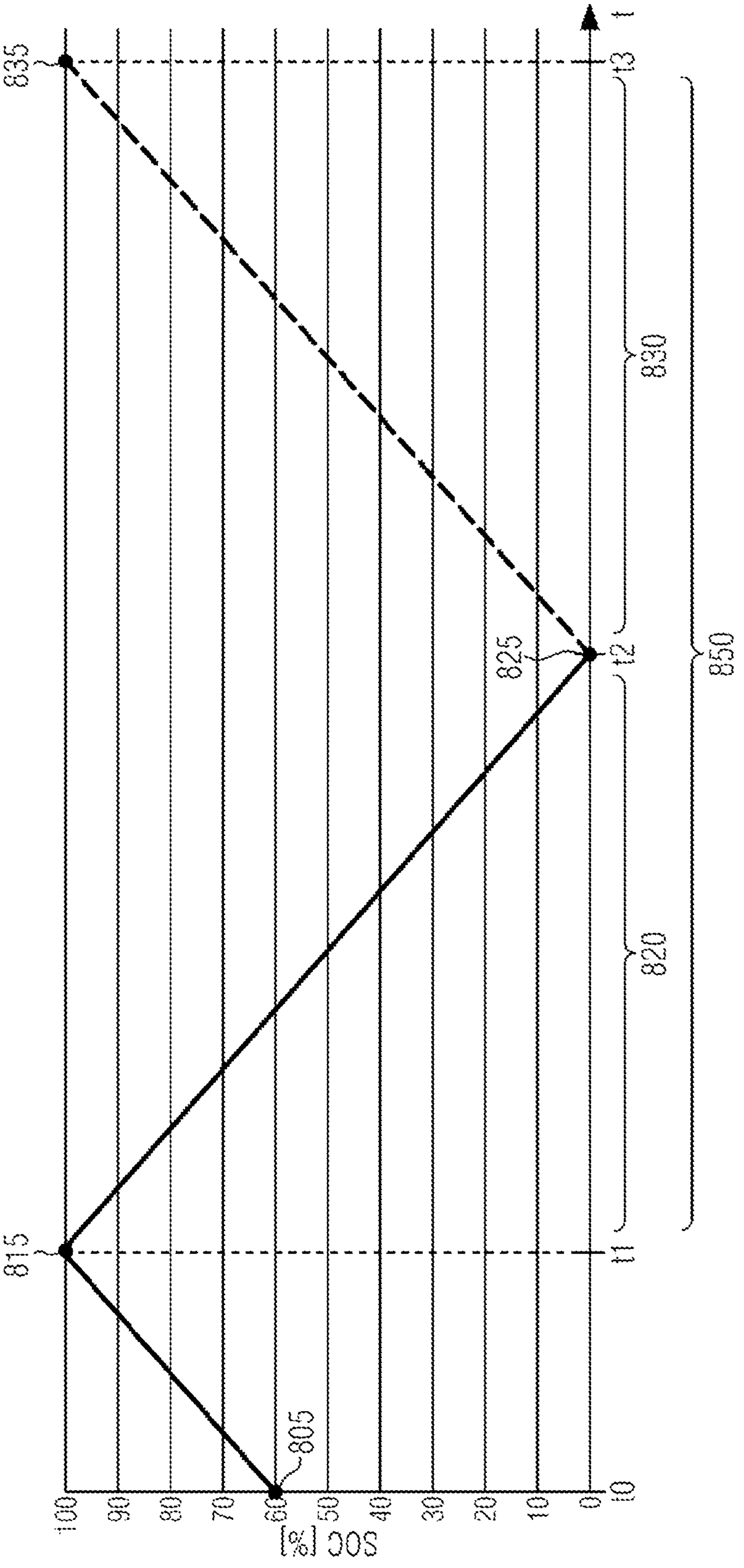
FIG. 8 shows the SOC behave over time for during a determination of the available capacity in an embodiment.

Methods to determine the available capacity are shown in FIG. 8. Alternatively, the rated or nominal capacity of a new energy storage device $C_N$ may be used.

A suitable starting point for the estimation may be reached by unbalancing the energy storage device P until it reaches its charge cutoff or discharge cut-off voltage, respectively corresponding to its fully (SOC=100%) or discharged state (SOC=0%).

An alternative estimation of the SOC uses the measured voltage during the relaxation process (629) on a SOC/OCV mathematical model previously estimated or provided by the battery cell manufacturer for a new energy storage device.

In an embodiment, the charge estimator may be designed as a classical ampere-hour counter with extensions like lookup tables or more complex estimation methods like a Kalman filter (extended, unscented, etc.), as a generalized Kalman filter in form of a particle filter, via neural networks etc. Indeed, the estimations will be more precise if the underlying parameter, the available capacity $C_x$ of the energy storage device, is determined as precisely as possible. Depending on the needed calculation power of the SOC estimator, the estimation may be calculated on the module controller unit (141-145). Alternatively, the estimation may be calculated on the central controller (160) or in the cloud (170).

In the above, SOC estimation models have been described. Additionally, it has been shown that the SOC estimation may depend on the available capacity of an energy storage device. The available capacity decreases as the energy storage system ages over time. Hence, the SOC estimation model may be updated by replacing the value of the available capacity with the new determined available capacity to improve the SOC estimate.

FIG. 8 illustrates an example of a full charging and discharging cycle of energy storage device P to determine the available capacity $C_x$ of the energy storage device P. In an embodiment, the energy storage device P is charged (810) from its current SOC state (SOC=60%) (805) to a substantially fully charged state (SOC=100%) (815) corresponding to the charge cut-off voltage. After the fully charged state (815) is reached, the energy storage device is discharged to its fully discharged state (SOC=0%) (825) associated with the discharge cut-off voltage. The available capacity $C_x$ is determined by measuring and integrating the measured current flow through the energy storage device P during discharge cycle (820) between t1 and t2.

Alternatively, the available capacity $C_x$ may be determined by applying and using a full cycle (850) for the measurement and determination. A full cycle may be applied by charging (830) the energy storage device from discharged state (825) back to its fully charged state (835), thereby measuring and integrating the measured current flow through the energy storage device P during the charge cycle (830) between t2 to t3. The available capacity $C_x$ is thereby determined by calculating an average value of the available discharge and charge capacity measurements. Alternatively, the smaller value of the available discharge and charge capacity may be used to indicate the available capacity $C_x$. The energy storage device P may be charged or discharged to another SOC or being assigned to the balancing algorithm and strategy again, which brings it back to the SOC of the other balanced modules.

In the above, it has been shown that the SOC estimation model may be updated by measuring the total charge transferred during one of a discharge, charge or full cycle. Further, it has been indicated that the available capacity $C_x$ decreases as the energy storage systems age over time.

The ageing of an energy storage system is preferably represented by the state of health, SOH, and may be estimated based on a ratio of the available capacity $C_x$ to the nominal capacity $C_N$ of a new energy storage device according to:

$$SOH = \frac{C_x(t)}{C_n}$$

Alternatively, the SOH may be estimated based on the rise of the internal resistance (712) in relation to the internal resistance of a new state. Alternatively, the SOH may take into account both of the mentioned ratios above and/or also include further embodiments.

In an embodiment, the available capacity $C_x$ may be determined based on the internal resistance (712) over time by equalizing the two SOH equations.

Figure 9:
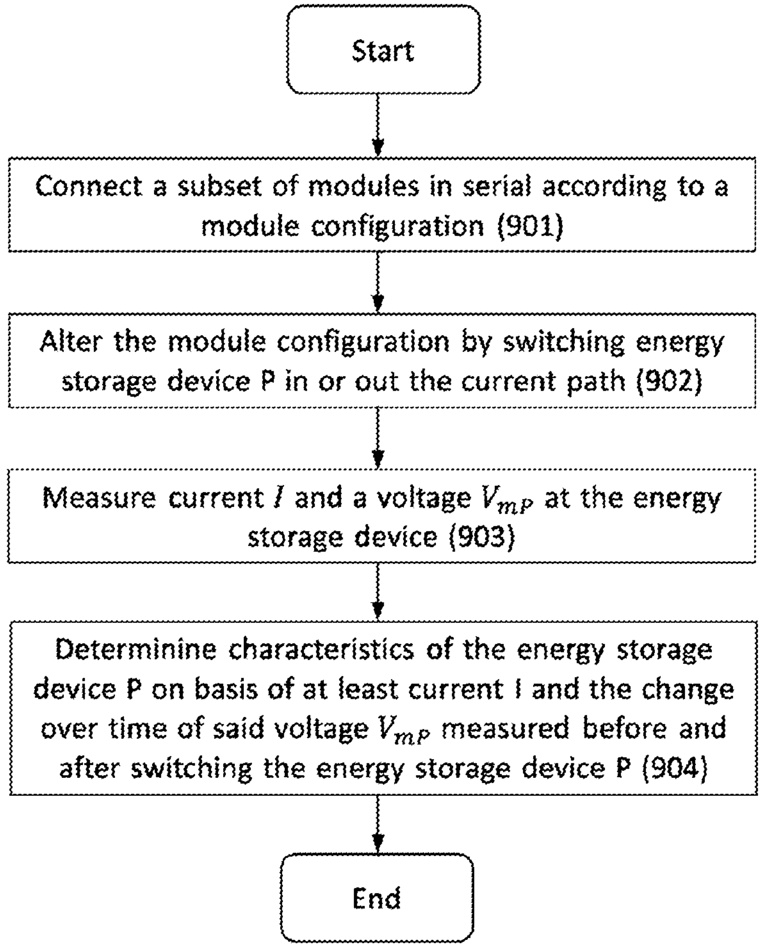
FIG. 9 shows a flow diagram of a method for determining characteristics of an energy storage device.

FIG. 9 shows a flow diagram of the method for determining characteristics of at least an energy storage device contained in an energy storage system, ESS, during operation of said ESS. The ESS comprising a plurality of modules, wherein each module comprising an energy storage device and a switching unit. In some embodiments, one or more of the steps may omitted, repeated, and/or performed in different order.

Initially, a subset of a plurality of modules may be connected by means of the switching units into a module configuration according to which the respective energy storage devices of the subset of modules M are serially connected into a current path to provide an output voltage of the ESS (901). Next, the module configuration is changed by switching an energy storage device P of at least one module into or out of the current path (902). In this way, a current change or rather a current transition is applied to a particular energy storage device P, resulting in a respective voltage response. Next, the current I and a voltage $V_{mP}$ at the energy storage device are measured (903). Subsequently, characteristics of the energy storage device P are determined on basis of at least the measured current I and the change over time of the voltage $V_{mP}$ measured before and after switching at the energy storage device P (904). Said characteristics represent the current status of said energy storage device P, such as parameters of an equivalent circuit diagram, internal resistance, SOH, etc.

In an embodiment, the current through a particular energy storage device may be measured by the respective module measurement unit (151-154). It is advantageous to measure the current at module level instead of string level to reduce measurement inaccuracies caused by interferences, the not always appropriate time sample coverage of the current measurement timing and changes in the switching state and impedances of the modules, cabling and filters.

Alternatively, the current through an energy storage device and module may be determined based on the measured current at string level by the string measurement unit (180) and the known switching state of the modules (111-114). The current $I_{mn}$ through module n (n being and integer with 0<n<N) may be determined according to:

$$I_{mn} = \frac{s_{mn}}{p} I_{AB},$$

wherein $s_{mn}$ is the switching status (1=active; 0=bypassed, −1=active with inversed polarity) of module n; p is the number of parallel modules with an integer p≥1, wherein for p=1 no parallel connections are used, and wherein $I_{AB}$ is the current flowing through the string. Accordingly, $I_{mP}$ describes the current at module P through energy storage device P.

In an embodiment, the current measurement may be performed several times to statistically determine measurement errors and/or reduce same.

In an embodiment, at least one of the current or voltage measurement may work with a sampling frequency greater than $10 \cdot f_0$, with $f_0$ being the mains frequency, to ensure a sufficiently high measurement accuracy. This is advantageous, since the amount of energy that has been flown per time unit may be balanced based on the current measurement and the sampling rate. Thus, the charge quantities may be added up per discharging and charging direction, which may allow an estimation of the total available capacity of the at least one energy storage device P in a more precise manner.

In an embodiment, the voltage and current measurements may be measured at a high temporal resolution more than 10 kHz. Alternatively, the voltage and current measurements may be measured at a low temporal resolution less than 10 kHz.

As previously discussed, the one or more values of the equivalent circuit diagrams may be temperature dependent. The measured values of an EIS at imaginary part=0 are a reliable measurement for the internal temperature of the energy storage device, not depending on aging or SOC. In an embodiment, a temperature determination similar to that with an EIS at imaginary part=0 may be carried out without additional measuring circuits. In more detail, depending on the load current and the respective timing, pulses may be generated to enable a temperature determination. Thus, on the one hand, temperature sensors may be eliminated and on the other hand, the parameter determination may be stored based on a more precise temperature.

In an embodiment, the ESS is composed of different energy storage devices at least in terms of mixed battery modules regarding voltage, SOC, SOH, used cell chemistry and number of cells. In an embodiment, batteries described herein may be li-ion based batteries. In an embodiment, cathode material such as $LiCoO2$, $LiMn2O4$, $Li(NiCoMn)O2$, $LiFePO4$, $LiNiCoAlO2$ may be used within the li-ion batteries.

In an embodiment, the module controller units (141-145) may process the measurement data and may perform the necessary mathematical functions.

In an embodiment, a logging may be carried out on the temporal course of the determined parameters. This is useful in particular, to determine how the SOH changes over time and between measurements. Depending on the available memory of the module controller units (141-145), this logging may also be performed on the higher-level central controller, externally in the cloud (170) or on a server belonging to a user.

In an embodiment, depending on their complexity and memory requirements, calculations may be performed on the central controller (160) or in the cloud (170). In this case, the task of the module controller units (141-145) may be restricted to data acquisition, aggregation and transmission.

Figure 10A:
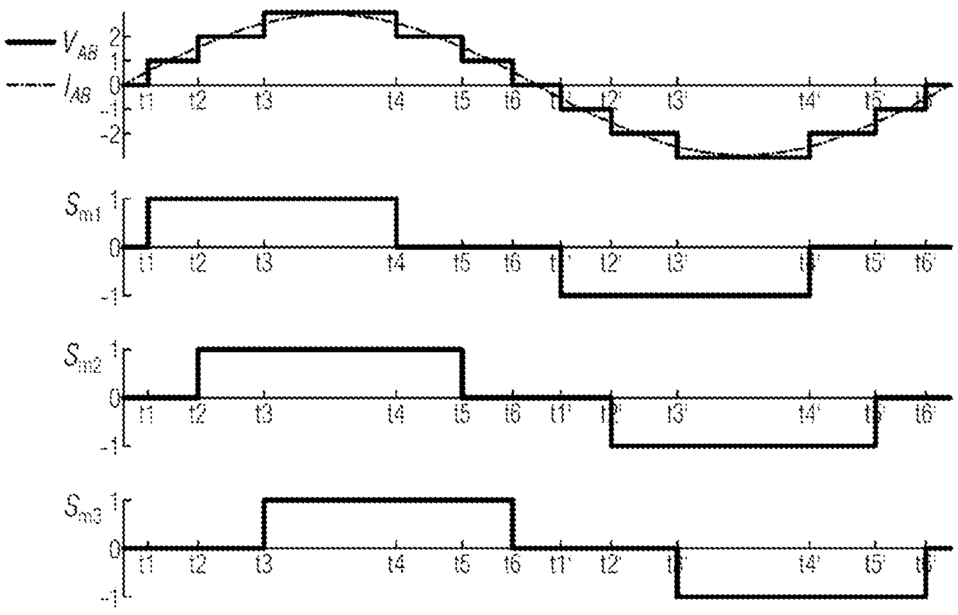
FIGS. 10A to 10D illustrate exemplary sequences of different module configurations over time to generate a sinusoidal string output voltage.
Figure 10B:
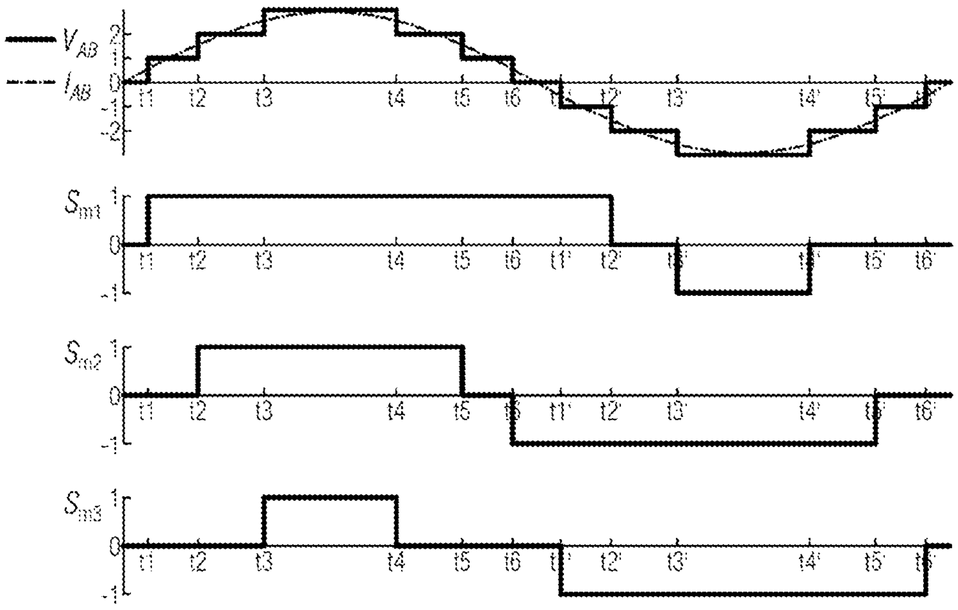
Figure 10C:
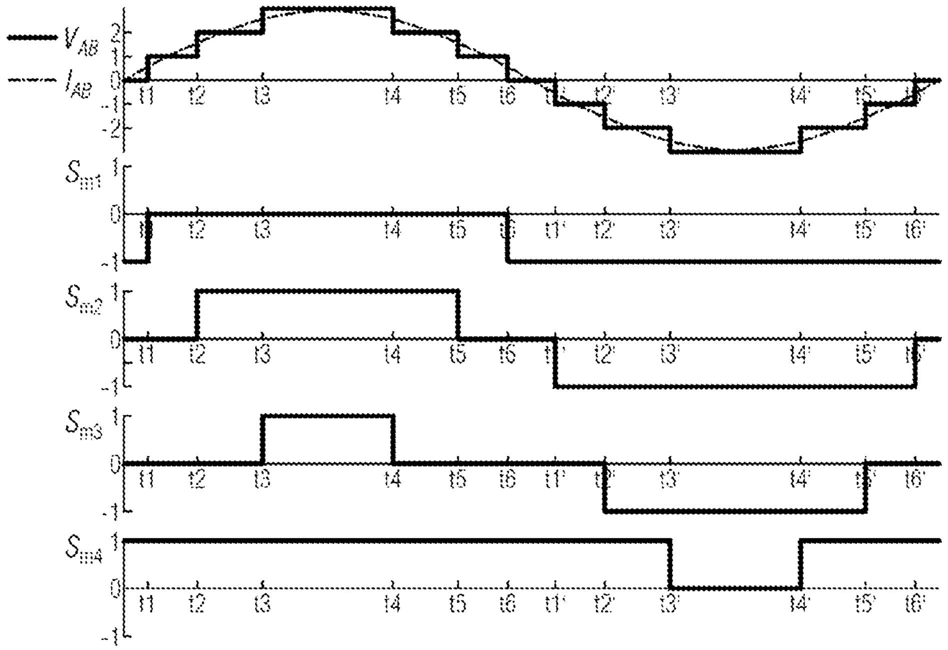
Figure 10D:
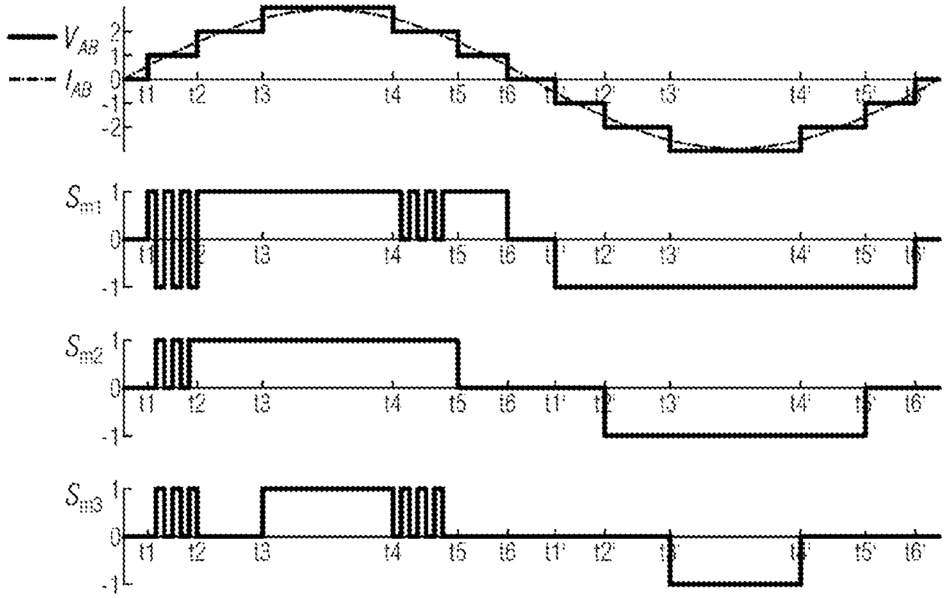
Figure 11A:
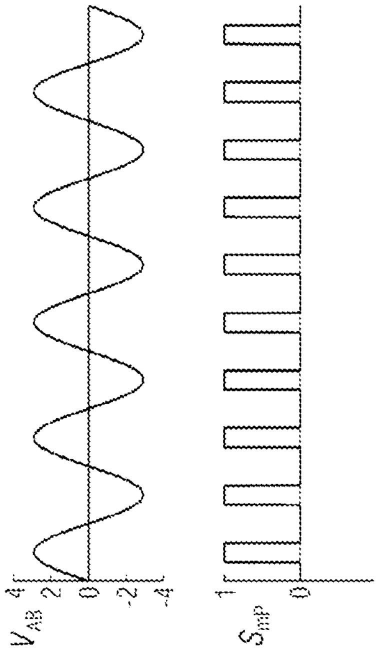
FIGS. 11A to 11D illustrate exemplary sequences of different module configurations over several sine wave periods to generate a sinusoidal string output voltage.
Figure 11B:
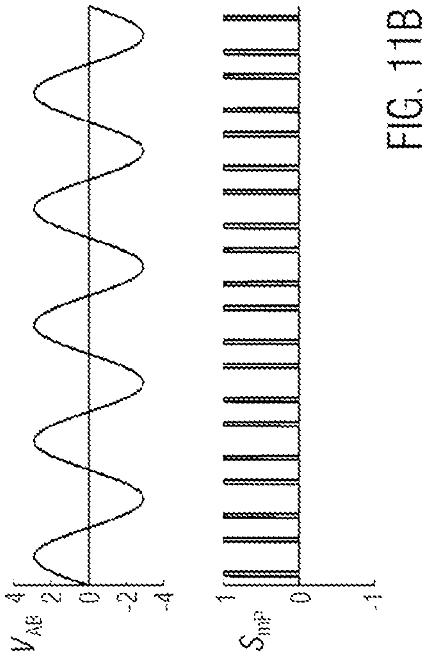
Figure 11C:
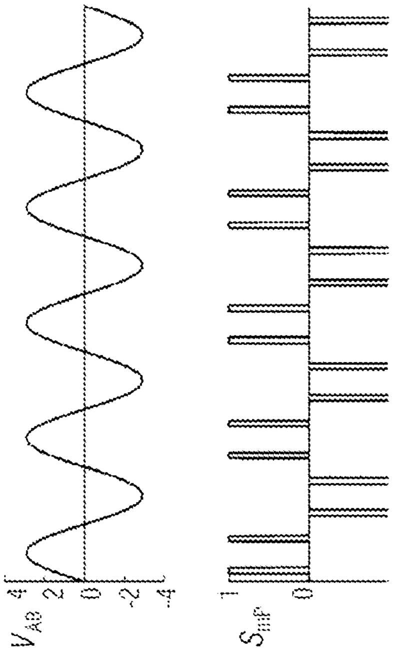
Figure 11D:
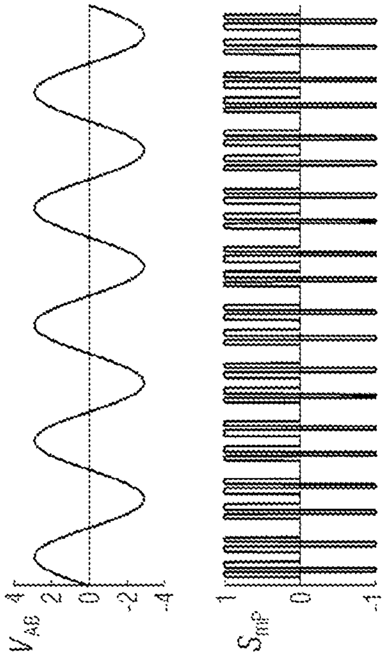

FIGS. 10A to 10D illustrate exemplary sequences of different module configurations or likewise pulse patterns over a sine wave period to generate a step shaped output voltage, which may approximate a sinusoidal string output voltage $V_{AB}$ resulting in an approximate sinusoidal current $I_{AB}$. The x-axis is over time any the y-axis gives output voltage level in units of $V_{bat}$. The figures are based on a simplified embodiment with a string having three modules. For grid voltages the frequency in Europe usually may be 50 Hz depending on the country, so a sine wave period has a duration of 20 ms. Also other frequencies are possible, e.g. railway (16.66 Hz) or aircraft supply voltages (400 Hz). For cars the frequency is variable from 1 Hz to 400 Hz and depending on the motor even higher, up to 1 kHz. Each pulse pattern shown in FIGS. 10A to 10D generates the same output voltage as shown in FIG. 5A. In the respective three lower subplots the y-axis illustrates the polarity and the activation of the respective module [−1, 0, 1] are shown (Module 1: $S_{m1}$, Module 2: $S_{m2}$, Module 3: $S_{m3}$). FIG. 10A illustrates a pulse pattern which may be used to substantially evenly load modules 1 to 3 to keep them balanced at a substantially same SOC. FIG. 10B shows a pulse pattern wherein the modules 1 has the largest load as its positive on-time where it provides power is larger than the negative on-time where it is charged. Module 3 is even charged, as the charging time is larger than the power delivery time. FIG. 10C illustrates a pulse pattern with four modules. FIG. 10D illustrates a pulse pattern with very short pulses corresponding to high-frequency and almost noise-like pulses. An equivalent circuit may also be parametrized using such noisy and high-frequency pulses. The dotted lines in FIGS. 10A to 10D illustrate schematically the resultant string current $I_{AB}$.

FIGS. 11A to 11D illustrate exemplary sequences of different module configurations over several sine wave periods to generate a sinusoidal string output voltage (x-axis: time, y-axis amplitude). In more detail, the lower diagrams of FIGS. 11A to 11D show the switching state of the particular module P (y-axis is the polarity and the activation of the module [−1, 0, 1]) from a plurality of modules used to generate the string output voltage illustrated in the respective upper diagram over several sine periods. According to FIG. 11A, the switching pattern shown in the lower diagram generates pulses with positive polarity and a frequency of 100 Hz (for a 50 Hz sine wave period) at the respective module. According to FIG. 11B, the switching pattern shown in the lower diagram generates pulses with positive polarity and a frequency of 200 Hz (for a 50 Hz sine wave period) at the respective module. According to FIG. 11C, the switching pattern shown in the lower diagram generates pulses with a frequency of 200 Hz (for a 50 Hz sine wave period) and a polarity change at every third pulse at the respective module. According to FIG. 11D, the switching pattern shown in the lower diagram generates triple pulses with alternating polarity [+1;−1;+1] at the respective module. The different pulse patterns illustrated in FIGS. 11A to 11D may be used to stimulate different chemical reactions of the energy storage device, which may result in diagnostic benefits.

Figure 12:
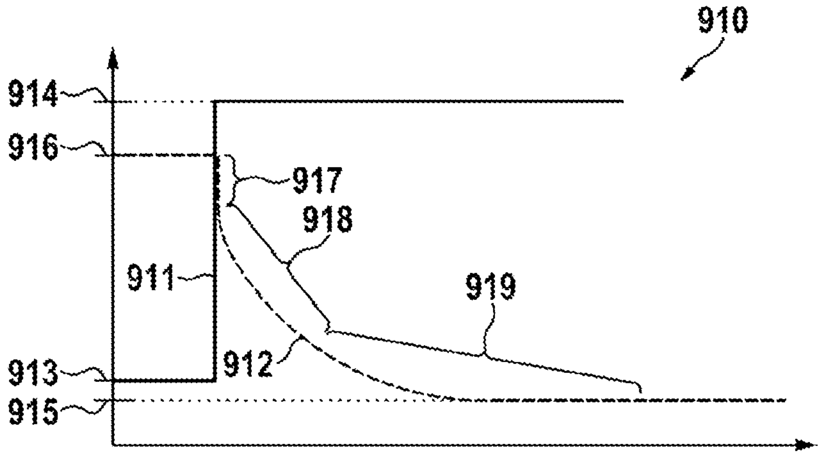
FIG. 12 shows in more detail in diagram 910 a current transition and the resulting change of battery voltage over time.

FIG. 12 shows in more detail in diagram 910 a current transition and the resulting change of battery voltage over time (horizontal axis). When the battery 221 is switched on, for example, by closing the series switch 225 and opening the parallel switch 224, this may result in a current rise as shown in curve 911 from a low current 913 to a high current 914. The voltage at the battery may drop as shown in curve 912 from a first voltage 916, which may be an idle voltage, to a voltage approximating a value 915. The function over time of the battery voltage is explained by the circuit diagram 730 of FIG. 7. The first voltage 916 may correspond to the voltage $U_{OCV}$ of the diagram 730. The voltage drop in the first section 917 is proportional to the current rise and is caused by the inner resistance $R_i$ of the battery. The second section 918 of the curve 912 is determined by the polarization which can be described by the first RC combination $RC_1$. The third section 919 of the curve 912 is determined by the diffusion in the battery which can be described by the second RC combination $RC_2$, and which normally has a longer time constant than the first RC combination.

The parameters of an equivalent circuit, e.g. as given in the circuit diagram 730 cannot be determined by a sampling before and another sampling after the current rise. Instead multiple samples have to be made to measure the waveforms.

In an embodiment, at least one sample of the battery voltage is measured before the current transition (which is when the switches change state) and a plurality of measurements are made after the current transition. The current transition coincides with a change of state, which is a change between a state where the energy storage device is connected between the at least one input and at least one output and another state having a short circuit between the at least one input and the at least one output. In the first state the battery may be connected to the string and in the second state the battery may be disconnected from the string.

There may be 10 to 100 samples, 20 to 200 samples or more than 100 samples measured after the change of state. The measurement of a sample before the change of state may be immediately before the change of state. It may be determined by the time resolution of the measuring devices employed, such that this measurement is clearly made before the transition. It may be made less than 100 microseconds before the transition to suppress low frequency deviations of the voltage. Measurement after the transition may start immediately after the transition. It may be determined by the time resolution of the measuring devices employed.

Further, at least one sample of current I is taken before and/or after the change of state. In an embodiment, the controller is configured to take at least one sample of current I before the state is changed from connecting the energy storage device between the at least one input and the at least one output to providing a short circuit between the at least one input and the at least one output, and to take at least one sample of current I after the state is changed from providing a short circuit between the at least one input and the at least one output to connecting the energy storage device between the at least one input and the at least one output. This improves efficiency in sampling and data processing, as no current measurements are made, when the battery is disconnected, which may result in a current close to zero.

In a perfect system with perfect measurement equipment a single measurement (including multiple samples) may be sufficient to specify the parameters of the equivalent circuit model. Normally an energy storage system may operate on a power grid while doing the measurement. Therefore, the environment is noisy and the currents are not rectangular but fragments of sine waves. Additionally, the measurement equipment is very simple and may include microcontrollers and simple integrated sensors.

In order to increase the quality of the measurement data, measurements have to be repeated multiple times. The measurement results may be fitted by mathematical methods (e.g. recursion, machine learning, support vector machines) to the battery model. It is beneficial to have a plurality of measurements (and therefore datapoints) in order to have meaningful battery model parameters.

One issue which will be taken into account by multiple measurements is the sample time error. Normally, a microcontroller has a distinct sample time. But with this distinct sample time it won't be able to directly measure e.g. the inner resistance since it will be represented as an instantaneous drop in battery voltage when a current is applied. Multiple measurements make it possible to more precisely determine the real instantaneous voltage drop. The inner resistance may be calculated as $R_i=|(V1-V0)/(I1-I0)|$. One has to keep in mind, that the resistance is dependent on temperature, SOC and SOH.

Measuring transient processes in a noisy environment gives distorted (=noisy) measurement results. In order to decrease the noise multiple measurements may to be taken. The noise may be reduced by the square root of the number of measurements.

Figure 13:
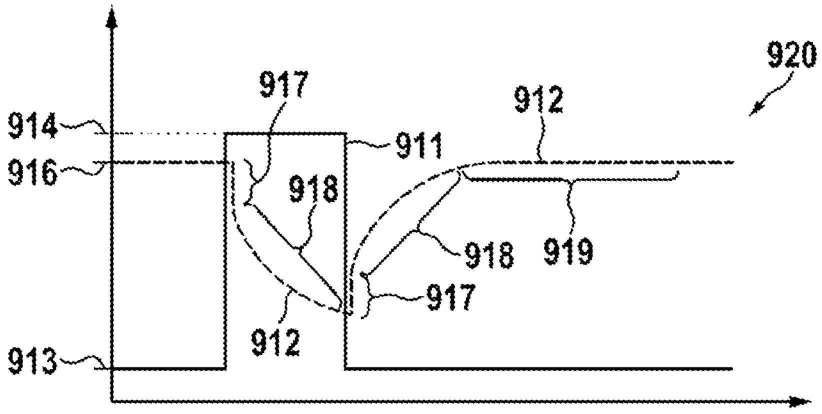
FIGS. 13 and 14 show different transition patterns.
Figure 14:
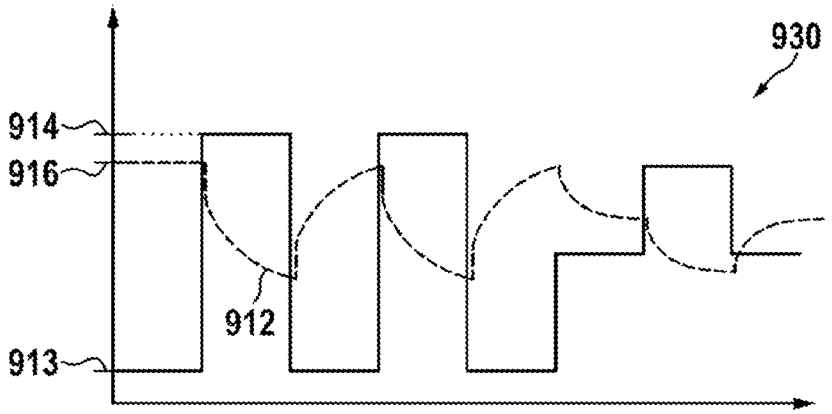

Relevant information can be obtained faster if the system does not wait for full relaxation but if it includes a new current pulse more frequently. The fast processes are harder to measure, so they have to be measured more often in order to increase data quality and validity. So the system may start new pulses before the end of third section 919 or even at the end or during the second section 918. This is shown in FIG. 13 with diagram 920 and FIG. 14 with diagram 930.

In order to correctly fit the model and to obtain a reliable SOH state, it may also necessary to repeat these measurements for different SOCs and temperatures. The basic idea is to gather relevant measurement information in order to have sufficient (low quality compared to lab measurements) data for mathematical methods of curve fitting for equivalent circuit models.

Also changing amplitude or direction of the current increases the data quality since new behaviors are being measured which have not been measured before. Ideally the fitting algorithm has an indicator of the data quality supplied and an indicator for "blind spots", e.g. measured behaviors where there is no or too little data material.

It will be appreciated to those skilled in the art having the benefit of this disclosure that this invention is believed to provide an energy storage system. Further modifications and alternative embodiments of various aspects of the invention will be apparent to those skilled in the art in view of this description. Accordingly, this description is to be construed as illustrative only and is provided for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

The invention claimed is:

1. An energy storage system (ESS) comprising:

at least one string of N modules with an integer $N>1$, the at least one string comprising at least one first end and at least one second end, wherein each module comprises:

at least one input and at least one output, wherein an at least one output of the (n)-th module is connected to an at least one input of the (n+1)-th module for each integer n with $0<n<N$, the input of a first module is connected to the at least one first end and an output of the (n+1)-th module is connected to the at least one second end;

an energy storage device;

a switching unit configured to switch between at least two states of operation including connecting the energy storage device between the at least one input and the at least one output, and providing a short circuit between the at least one input and the at least one output;

and a controller configured to perform the following steps during on-load operation of the ESS:

to change a state of at least one switching unit of a P-th module $P_m$ with 0<P<=N, to measure a current I and a voltage $V_{mP}$ at an energy storage device P of the P-th module $P_m$, and to determine characteristics of the energy storage device P on a basis of at least the current I and a change over time of said voltage $V_{mP}$ measured before and after a change of the state of the at least one switching unit of the P-th module $P_m$, wherein at least one sample of the voltage $V_{mP}$ is taken before the change of said state and a plurality of samples of the voltage $V_{mP}$ is taken after the change of said state, and at least one sample of current I is taken before and/or after the change of said state, and wherein said controller is configured to take at least one sample of the current I before the state of the at least one switching unit is changed from said connecting the energy storage device between the at least one input and the at least one output to said providing a short circuit between the at least one input and the at least one output, and to take at least one sample of current I after the state of the at least one switching unit is changed from said providing a short circuit between the at least one input and the at least one output to said connecting the energy storage device between the at least one input and the at least one output.

2. An energy storage system of claim 1, wherein said controller is further configured to determine said characteristics of the energy storage device P on a basis of an estimated state of charge (SOC) of such energy storage device.

3. An energy storage system of claim 1, wherein said controller is configured to average measured values of the voltage $V_{mP}$ and current I over multiple changes of the state of the at least one switching unit of the P-th module $P_m$, and/or to calculate multiple equivalent circuit parameters based on the measured values of the voltage $V_{mP}$ and current I.

4. An energy storage system of claim 1, wherein said controller is configured to repeatedly change the state of at the least one switching unit of the P-th module $P_m$ and/or wherein the controller is further configured to control the energy storage device P to charge or discharge to a predefined state of charge (SOC) level or to a predefined voltage.

5. An energy storage system of claim 1, wherein the switching unit is configured to select, in the state of said connecting the energy storage device between the at least one input and at least one output, a polarity of the energy storage device.

6. An energy storage system of claim 1, wherein the controller is further configured to change states of corresponding switching units of a subset of M modules with M<=N, wherein such changes of the states are made such that modules of the plurality of modules are used over time in a balanced manner to achieve a balanced state of charge (SOC) for energy storage devices with an exception of at least the module $P_m$ of an energy storage device P, said at least the module $P_m$ being comparatively unbalanced to achieve charging or discharging that is faster than that of the remaining modules.

7. An energy storage system of claim 1, wherein determined characteristics of the energy storage device P comprise at least one or more parameters of an equivalent circuit including an internal resistance of the energy storage device P at one or more state of charge (SOC) levels.

8. An energy storage system of claim 1, wherein each energy storage device includes at least one of: a battery, a battery cell, a battery pack, a fuel cell, a stack of fuel cells, a solid state battery, and a high-energy capacitor.

9. An energy storage system of claim 1, wherein at least one switching unit is configured to switch at least two energy storage devices in series and/or in parallel, and wherein the at least one switching unit comprises at least one of:

a three pole switch, a half bridge, wherein a half-bridge comprises two switches;

two half-bridges; and one or two full bridges, wherein each full bridge comprises four switches and/or a battery switch to bypass a corresponding energy storage device.

10. An energy storage system of claim 1, wherein the controller comprises:

a plurality of controller units, each controller unit being associated with one or more modules, and one or more measurement units configured to measure at least one of the current through and the voltage at a corresponding energy storage device.

11. A method for determining characteristics of energy storage devices of an energy storage system (ESS) during an on-load operation of said ESS, the method comprising:

performing, with the ESS according to claim 1, at least the following steps:

changing a state of the switching unit of a P-th module $P_m$ with 0<P<=N either by connecting a corresponding energy storage device P of the P-th module $P_m$ between the at least one input and the at least one output, or by providing a short circuit between the at least one input and the at least one output;

measuring a current I and a voltage $V_{mP}$ at the energy storage device P of the P-th module $P_m$, and determining characteristics of the energy storage device P on a basis of at least the current I and a change over time of said voltage $V_{mP}$ measured before and after a change of the state of the switching unit of the P-th module $P_m$, wherein at least one sample of the voltage $V_{mP}$ is taken before the change of said state and a plurality of samples of the voltage $V_{mP}$ is taken after the change of said state and at least one sample of current I is taken before and/or after the change of said state.

12. A method of claim 11, wherein the characteristics of the energy storage device P comprise at least one of:

one or more parameters of an electric equivalent circuit diagram including an internal resistance, and state of health (SOH) of the energy storage device P;

and/or wherein the determining characteristics of the energy storage device P is further based on at least one of:

an estimated state of charge (SOC) of the energy storage device P, wherein the SOC is estimated by integrating the current through the energy storage device P and dividing the integrated current by an available capacity Cx of the energy storage device P, and/or an assessed temperature of the energy storage device P.

13. A method of claim 11, wherein said determining characteristics of the energy storage device P further comprises determining the available capacity $C_x$ of the energy storage device P by applying at least one substantially fully discharge and/or charge cycle to the energy storage device P, thereby integrating current I to obtain a total charge transfer during the at least one substantially fully discharge or charge cycle.

14. A method of claim 11, wherein the state of health is estimated by at least one of:

dividing the available capacity $C_x$ by a nominal capacity CN of a new energy storage device P, and dividing an actual internal resistance by a nominal internal resistance of the new energy storage device P.

* * * * *